United States Patent [19]

Mayfield

[11] Patent Number: 5,276,394
[45] Date of Patent: Jan. 4, 1994

[54] COMPENSATED TRANSFORMERS

[75] Inventor: Glenn A. Mayfield, West Lafayette, Ind.

[73] Assignee: Radian Research, Inc., Lafayette, Ind.

[21] Appl. No.: 905,114

[22] Filed: Jun. 26, 1992

[51] Int. Cl.$^5$ .............................................. H01F 40/14
[52] U.S. Cl. ...................................... 323/356; 323/357
[58] Field of Search ............... 323/356, 357, 358, 359; 324/127

[56] References Cited

U.S. PATENT DOCUMENTS 3,534,247 10/1970 Miljanic .
4,628,251 12/1986 Halder ................................. 323/356
4,841,236 6/1989 Miljanic et al. ..................... 324/127

FOREIGN PATENT DOCUMENTS 2812303 10/1979 Fed. Rep. of Germany ...... 323/356

OTHER PUBLICATIONS

Beard "Single-Stage Amplifier-Aided Current Transformers Possessing Small Ratio Errors at 60 Hz", IEEE Trans. on Inst. & Meas., vol. IM-28 No. 2, pp. 141-146, Jun. 1979.

Primary Examiner—William H. Beha, Jr.
Attorney, Agent, or Firm—Barnes & Thornburg

[57] ABSTRACT

A transformer having a primary winding and a secondary winding across which load is coupled is compensated. A third winding is provided on the transformer. A first output terminal of an amplifier is coupled to a first terminal of the primary winding. A first terminal of the third winding is coupled to the second terminal of the primary winding. A second terminal of the third winding is coupled to an input terminal of the amplifier.

28 Claims, 26 Drawing Sheets

COMPENSATED TRANSFORMERS

Current transformers (CT's) are used in instrumentation to multiply and divide currents by exact turns ratios. This capability can be quite beneficial for both measurement and calibration techniques. Current transformers, unfortunately, have two classical, unresolved problems that affect size (and thus cost) and accuracy. These problems are the achievement of infinite flux density and zero exciting current. As noted in MAGNETICS, A Division of Spang and Company, *Design Manual Featuring TAPE WOUND CORES*, TWC-300T, Butler, Pa., 1987, p. 30.

[These] conditions are interdependent and have never been fully achieved. . . . The maximum usable flux density determines the physical size core necessary for a certain volt-ampere capacity current transformer. . . . The exciting current determines the maximum accuracy that can be achieved with a current transformer. . . . The final selection of the core to be used for a particular current transformer application will depend on whether accuracy or size is the primary objective.

These problems and how they are interdependent can be illustrated with the circuit in FIG. 1. The current flow in the secondary of the transformer ($i_L$) causes a voltage burden ($v_L$) to be developed across the load resistor ($R_L$). As can be seen from FIG. 1, this voltage burden also appears across the hysteresis/eddy current losses resistor ($R_h$) and the magnetizing inductance ($L_m$) of the CT. By Faraday's Law, this voltage sets up a flux field. The core of the transformer must be large enough to support this field without saturating. This affects the size of the transformer. This voltage also introduces an error current through $L_m$ and $R_h$ that is shunted away from $R_L$. This error current is the vector sum of the exciting currents which flow in $L_m$ and $R_h$. This error current limits the accuracy of the transformer. The error current and the volt-ampere (VA) rating of the core are directly proportional to $V_L$. Any reduction in the magnitude of $V_L$ causes a proportional reduction in transformer error and required VA capacity.

The classical approaches to CT's have involved techniques that either make the transformer better able to deal with the effects of the voltage burden presented by the load or that reduce the voltage burden presented by the load. Many solutions have used combinations of these two techniques. Techniques that improve the transformer's ability to deal with the burden include:

1. Make the core large to keep the flux density low;
2. Make the number of coil turns large to maximize the magnetizing inductance, lower the total flux, and keep the hysteresis/eddy current losses low;
3. Use a high permeability, low loss core material to maximize magnetizing inductance and reduce hysteresis/eddy current losses;
4. Use a high flux density capable core material to reduce core size; and
5. Adjust the transformer's turns ratio to compensate for errors.

Techniques that reduce the voltage burden include:
1. Reduce the load resistor and thus the voltage burden and use amplification to recover the voltage output lost in the current to voltage conversion; and
2. Use an operational amplifier as a transconductance amplifier and reduce the load resistor to virtually zero.

Each potential solution carries with it its own problems.

According to one aspect of the invention, means for compensating a transformer having a primary winding and a secondary winding for hysteresis/eddy current loss resistance and magnetizing inductance induced errors comprises a load resistor, and means for coupling the load resistor across the secondary winding. The means for coupling the load resistor across the secondary winding includes a third winding on the transformer, an amplifier, and means for coupling a first input terminal of the amplifier to a first terminal of the secondary winding. The third winding couples an output terminal of the amplifier to the load resistor and to a second terminal of the secondary winding.

Illustratively according to the invention, the amplifier is a difference amplifier. The output terminal of the difference amplifier is coupled to a second, inverting input terminal thereof to configure the amplifier as an approximately unity gain amplifier.

Additionally illustratively according to the invention, the third winding has the same polarity as the secondary winding.

Further illustratively according to the invention, a fourth winding is provided on the transformer. Means are provided for coupling a first terminal of the fourth winding to the second terminal of the secondary winding, and means are provided for coupling a second terminal of the fourth winding to a second input terminal of the amplifier.

Additionally illustratively according to the invention, the amplifier comprises a difference amplifier. The second input terminal of the amplifier comprises an inverting input terminal thereof.

Further illustratively according to the invention, the fourth winding has the same polarity as the secondary winding. Illustratively, the third and fourth windings have the same number of turns.

Further illustratively according to the invention, a second transformer has first and second windings. Means are provided for coupling a first terminal of each of the first and second windings of the second transformer to the output terminal of the amplifier. A second terminal of the first winding is coupled to the second input terminal of the amplifier. A second terminal of the second winding of the second transformer is coupled to the second terminal of the fourth winding. The means for coupling the second terminal of the fourth winding to the second input terminal of the amplifier comprises the second transformer.

Illustratively according to the invention, the first and second windings of the second transformer have the same number of turns.

Further illustratively according to the invention, a high frequency stabilizing circuit includes a second amplifier. Means are provided for coupling the secondary winding across an input terminal and an output terminal of the second amplifier. Means provide a low-pass filter. The low-pass filter is coupled to the output terminal of the second amplifier. Illustratively, the low-pass filter comprises an R-C filter.

Further illustratively according to the invention, the means for coupling the secondary winding across an input terminal and the output terminal of the second amplifier includes the second transformer.

Illustratively, the means for coupling the secondary winding across an input terminal and the output terminal of the second amplifier further comprises the fourth winding.

Additionally illustratively according to the invention, the second amplifier comprises a difference amplifier including the first-mentioned input terminal and a second, inverting input terminal. Means are provided for coupling the inverting input terminal of the second amplifier to its output terminal in substantially unity gain, non-inverting configuration.

Illustratively, a resonance damping resistor is coupled across the secondary winding. Illustratively, the means for coupling the resonance damping resistor across the secondary winding includes the low-pass filter and the output terminal of the second amplifier.

According to another aspect of the invention, means for compensating a transformer having a primary winding and a secondary winding for hysteresis/eddy current loss resistance and magnetizing inductance induced errors comprises a load resistor, means for coupling the load resistor across the secondary winding, a third winding on the transformer, and an amplifier. Means are provided for coupling a first output terminal of the amplifier to a first terminal of the primary winding. Means are provided for coupling a first terminal of the third winding to the second terminal of the primary winding. Means are provided for coupling a second terminal of the third winding to an input terminal of the amplifier.

Illustratively, the amplifier comprises a difference amplifier. The input terminal of the amplifier comprises an inverting input terminal thereof.

Additionally illustratively, the third winding has the same polarity as the primary winding. Illustratively, the primary and third windings have the same number of turns.

Further illustratively, a second transformer has first and second windings. Means are provided for coupling a first terminal of each of the first and second windings of the second transformer to the output terminal of the amplifier. Means are provided for coupling a second terminal of the first winding to the second input terminal of the amplifier. Means are provided for coupling a second terminal of the second winding of the second transformer to the second terminal of the third winding. The means for coupling the second terminal of the third winding to the input terminal of the amplifier comprises the second transformer.

Illustratively, the first and second windings of the second transformer have the same number of turns.

Additionally illustratively, the transformer compensating means further comprises a high frequency stabilizing circuit including a second amplifier, means for coupling the secondary windings across an input terminal and an output terminal of the second amplifier, a low-pass filter, and means for coupling the low-pass filter to the secondary winding and to the output terminal of the second amplifier. Illustratively, the low-pass filter comprises an R-C filter.

Additionally illustratively, the transformer compensating means further comprises a resonance damping resistor and means for coupling the resonance damping resistor across the secondary winding. Illustratively, the means for coupling the resonance damping resistor across the secondary winding includes the low-pass filter and the output terminal of the second amplifier.

The invention may best be understood by referring to the following description and accompanying drawings which illustrate the invention. In the drawings.

Figure 1:
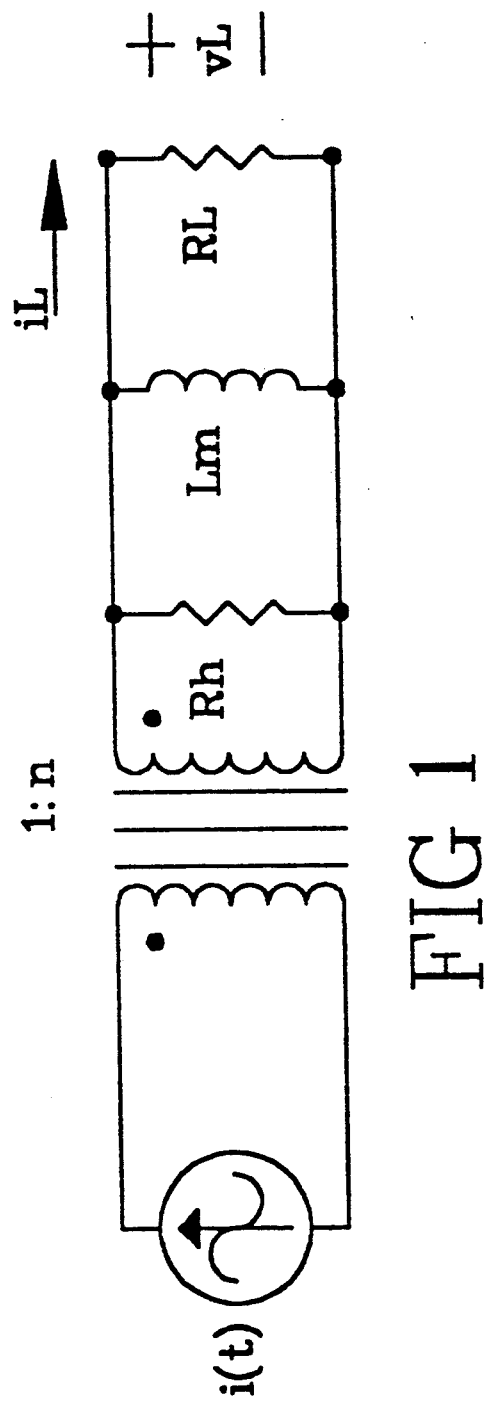
FIG. 1 illustrates the problems of achievement of infinite flux density and zero exciting current and how they are interdependent.
Figure 2:
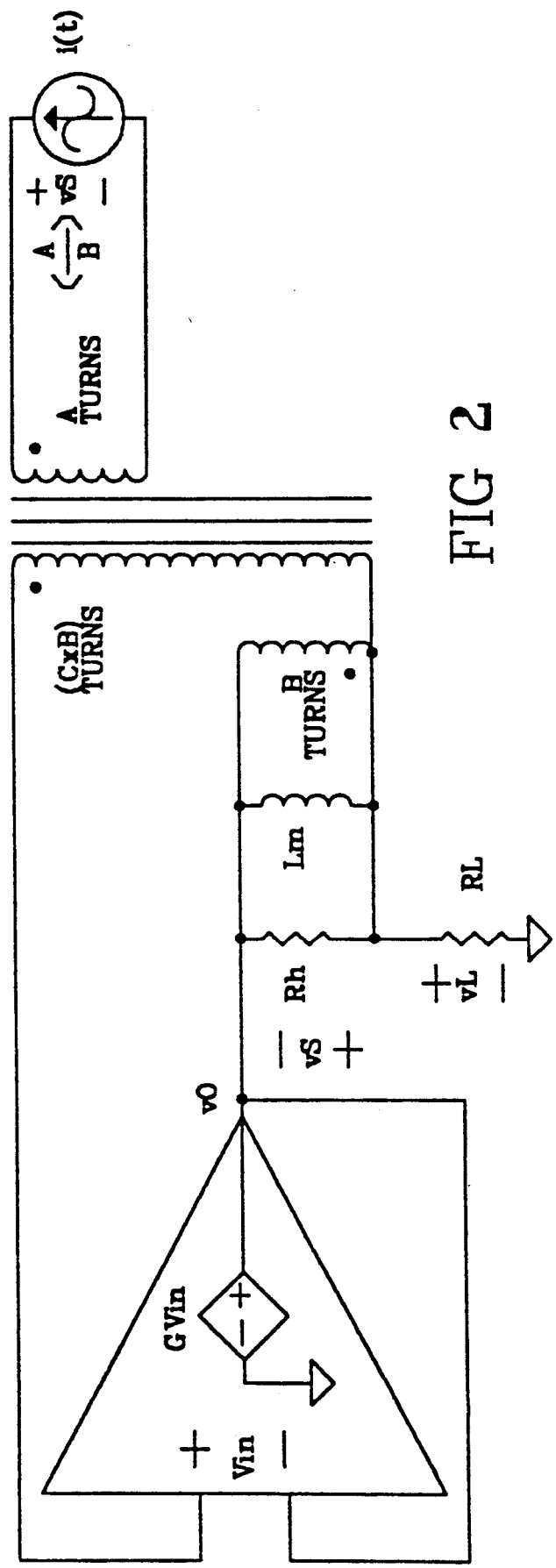
FIG. 2 illustrates a technique for reducing the voltage burden presented to a transformer according to the invention.
Figure 3:
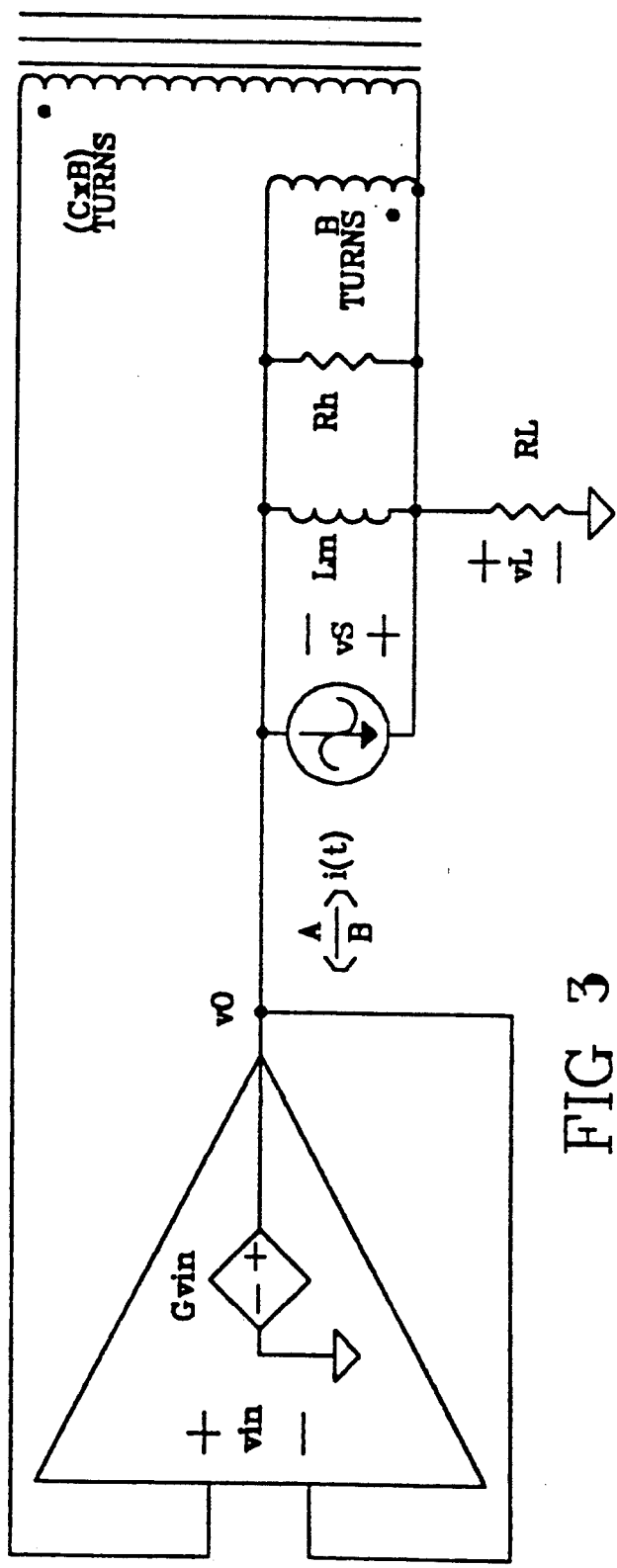
Figure 4:
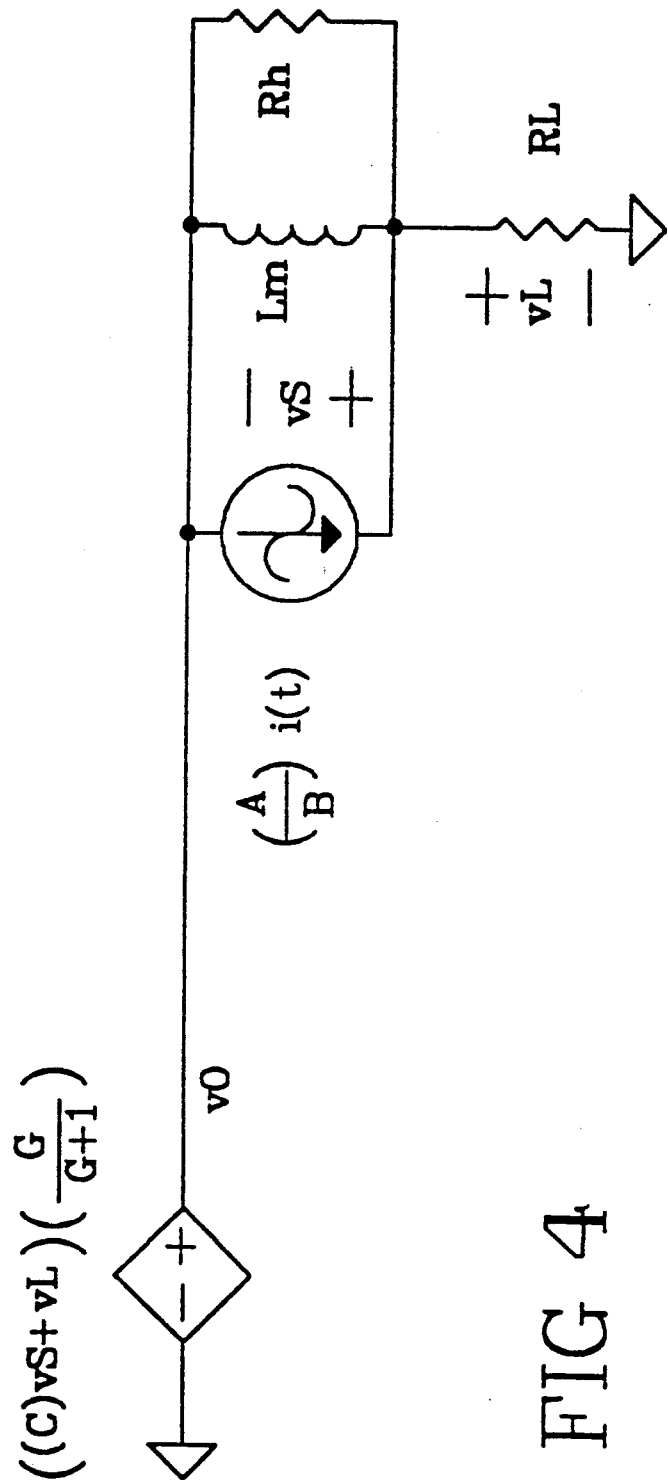
Figure 5:
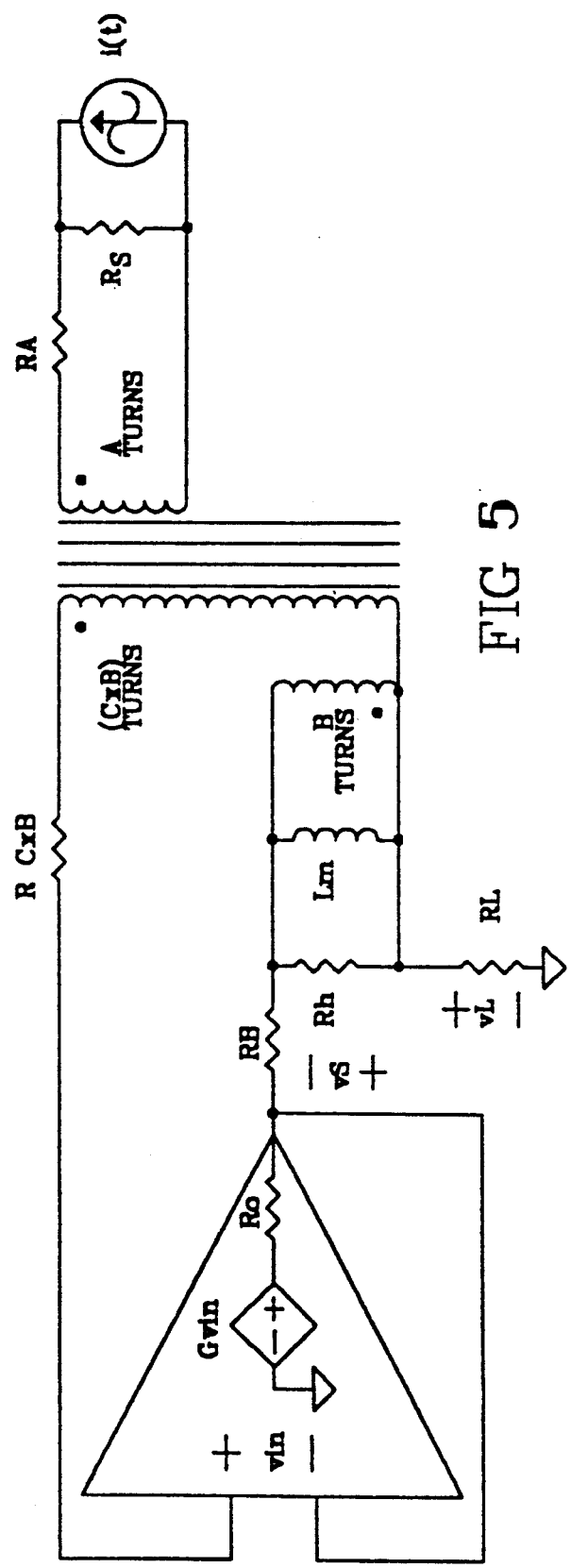
Figure 6:
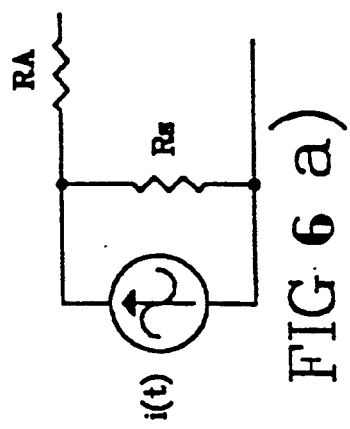
Figure 6:
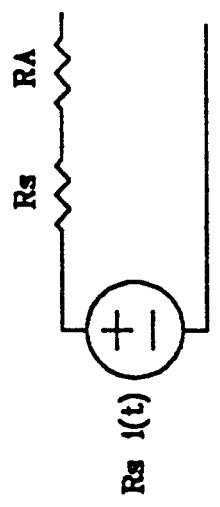
Figure 6:
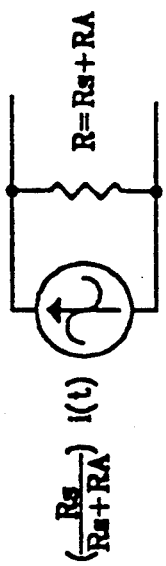
Figure 7:
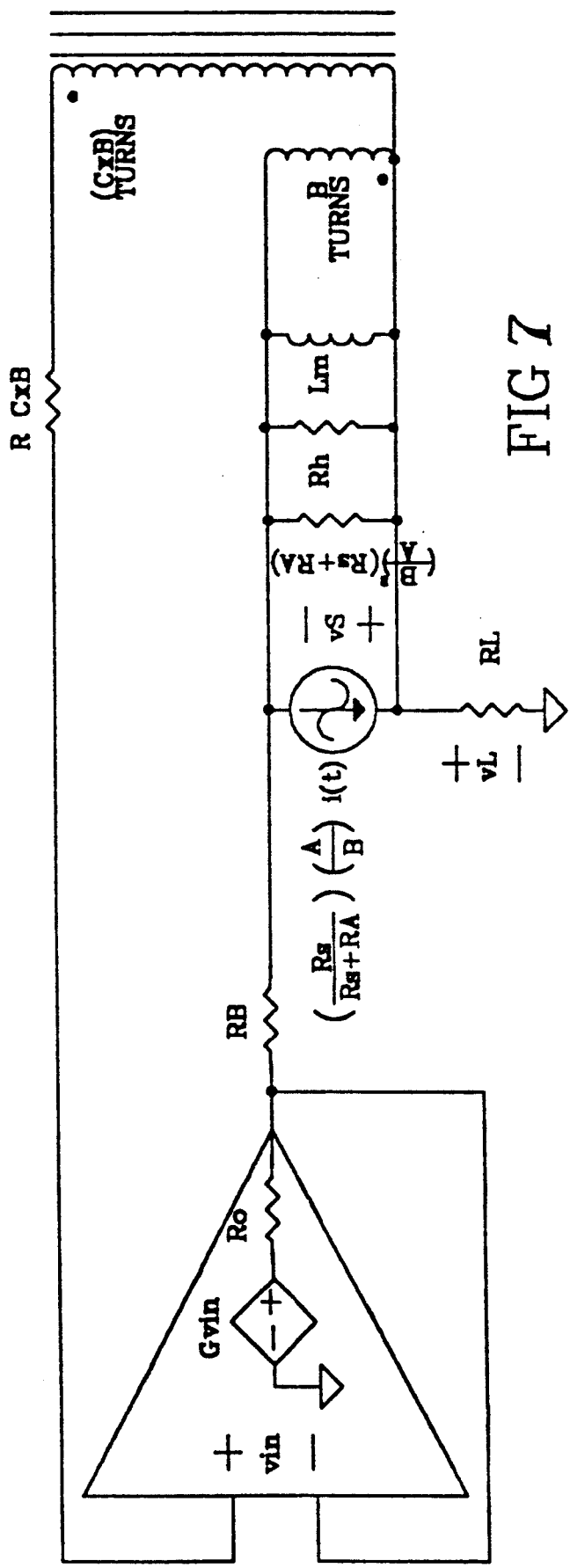
Figure 8:
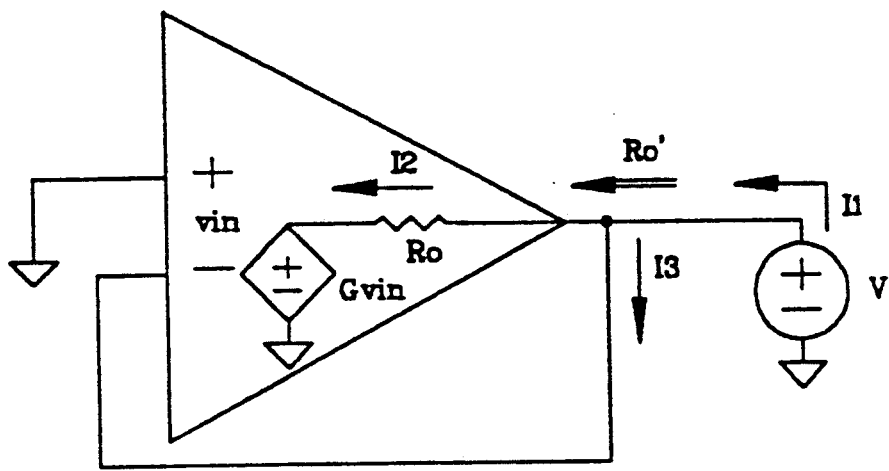
Figure 9:
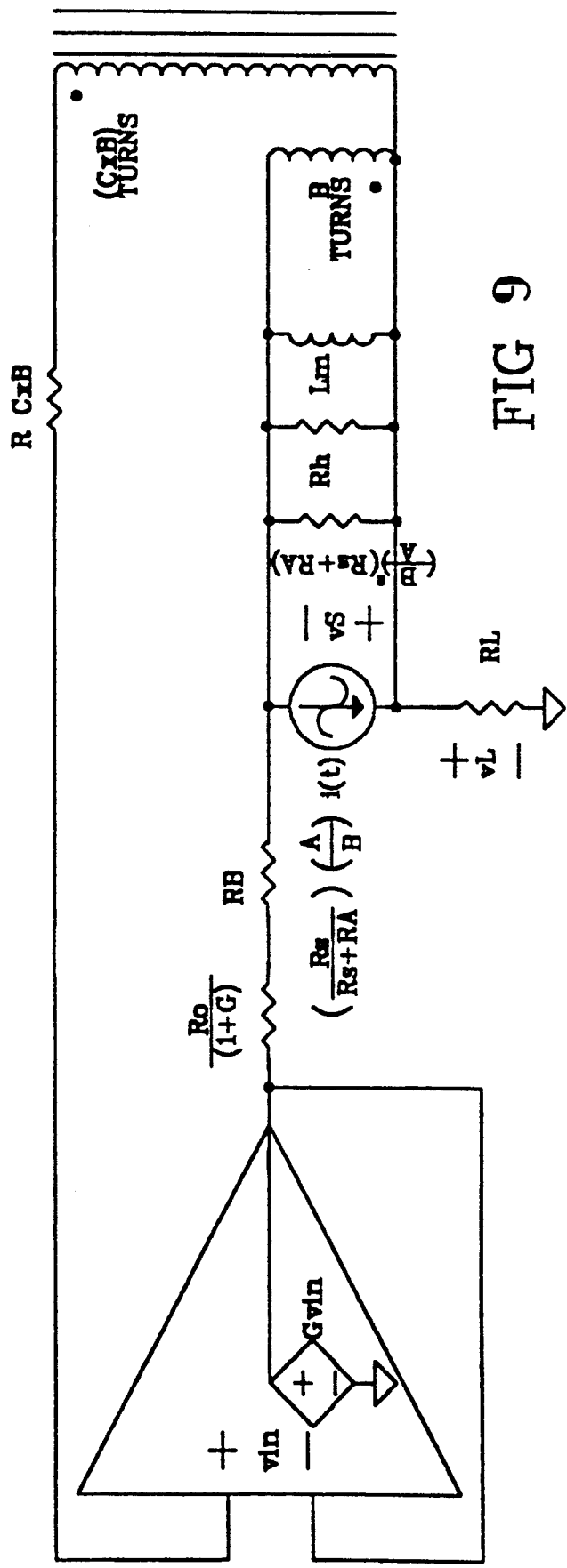
Figure 10:
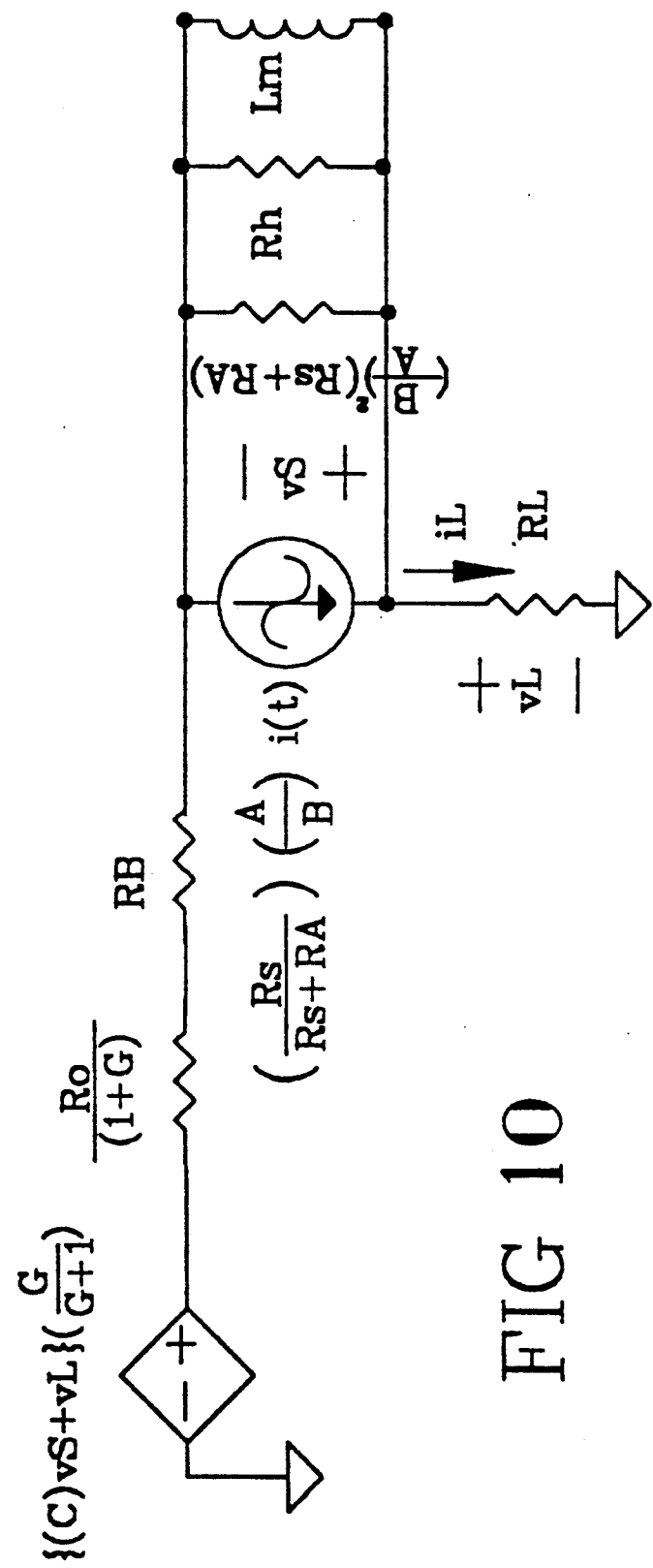
Figure 11A:
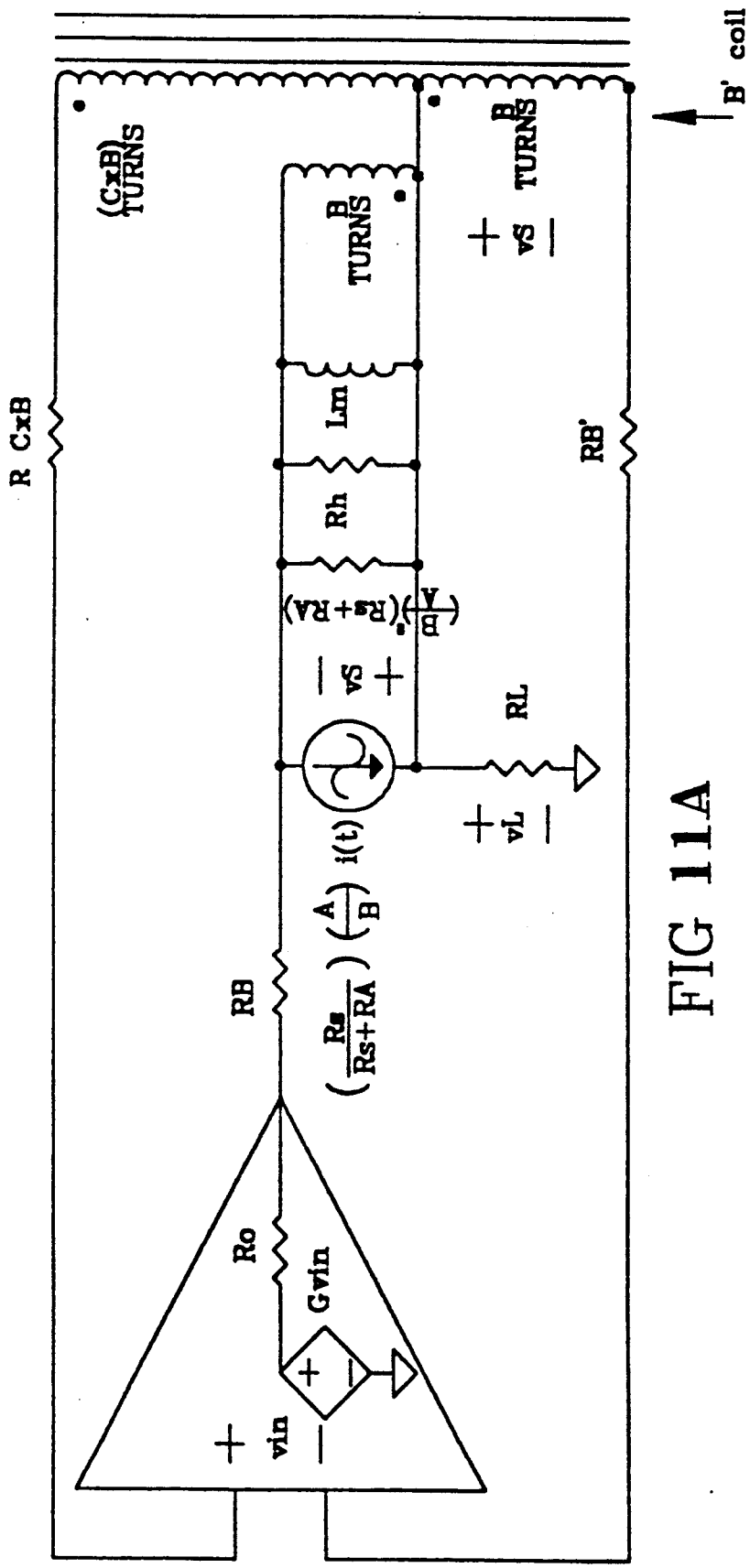
Figure 11B:
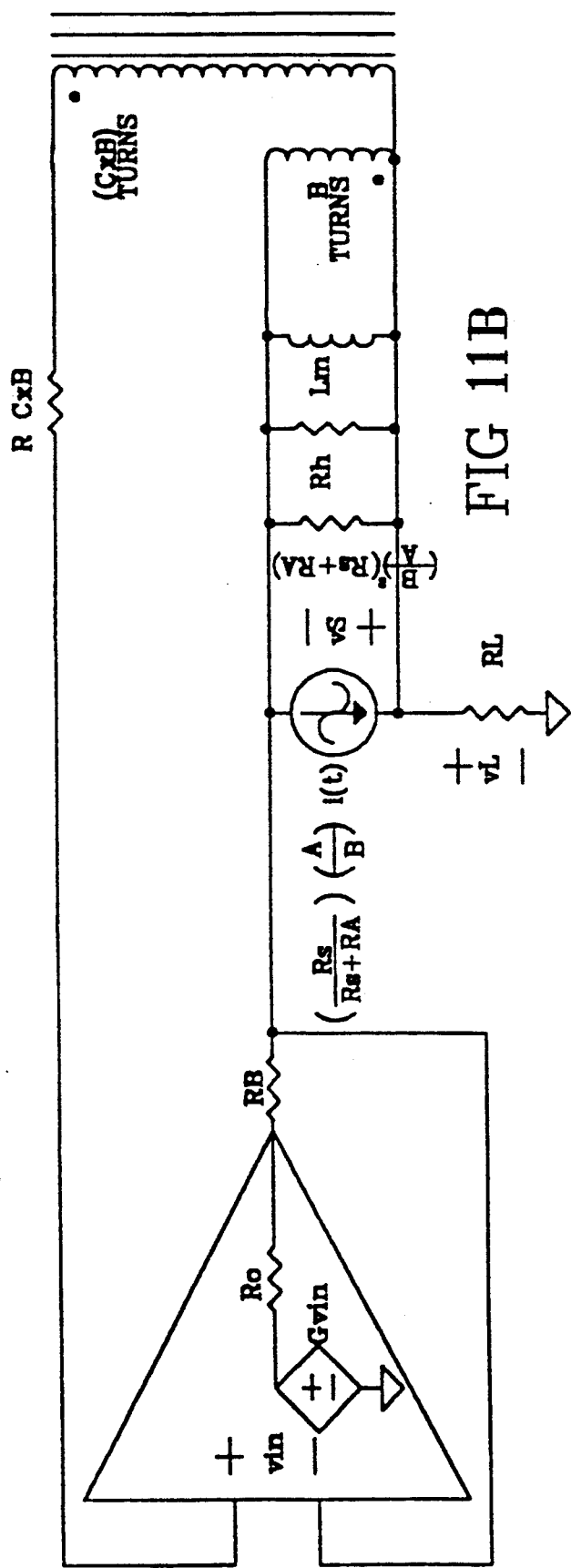
Figure 12:
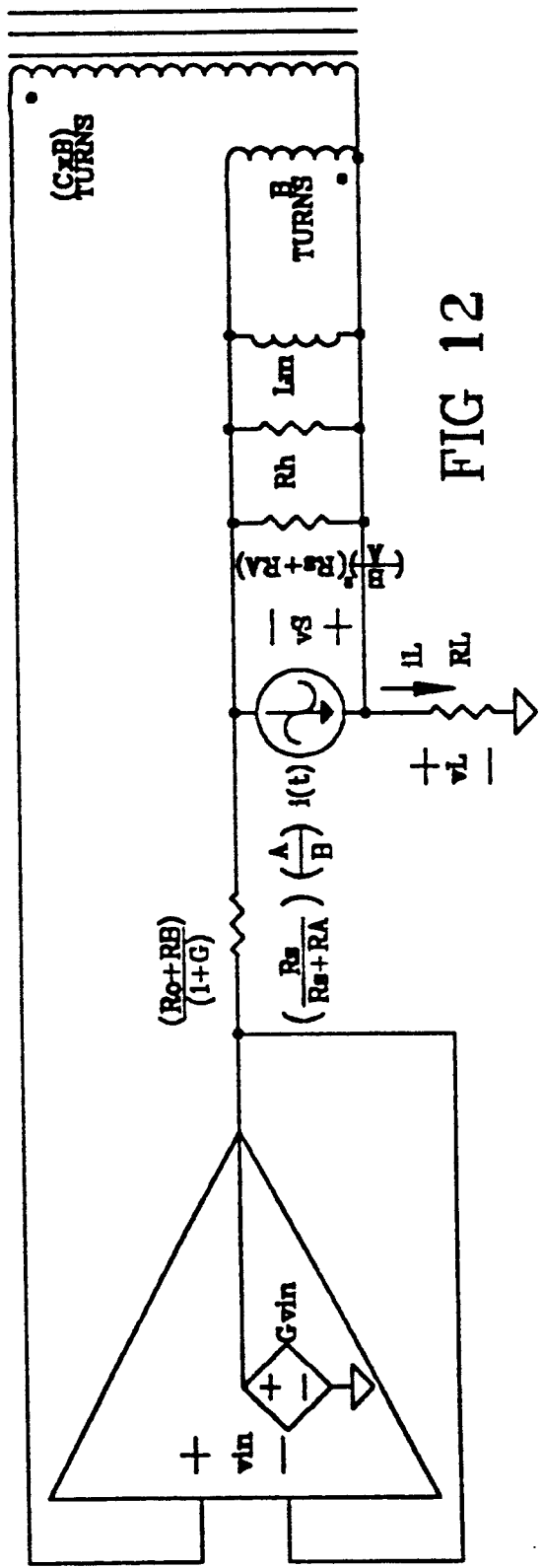
Figure 13:
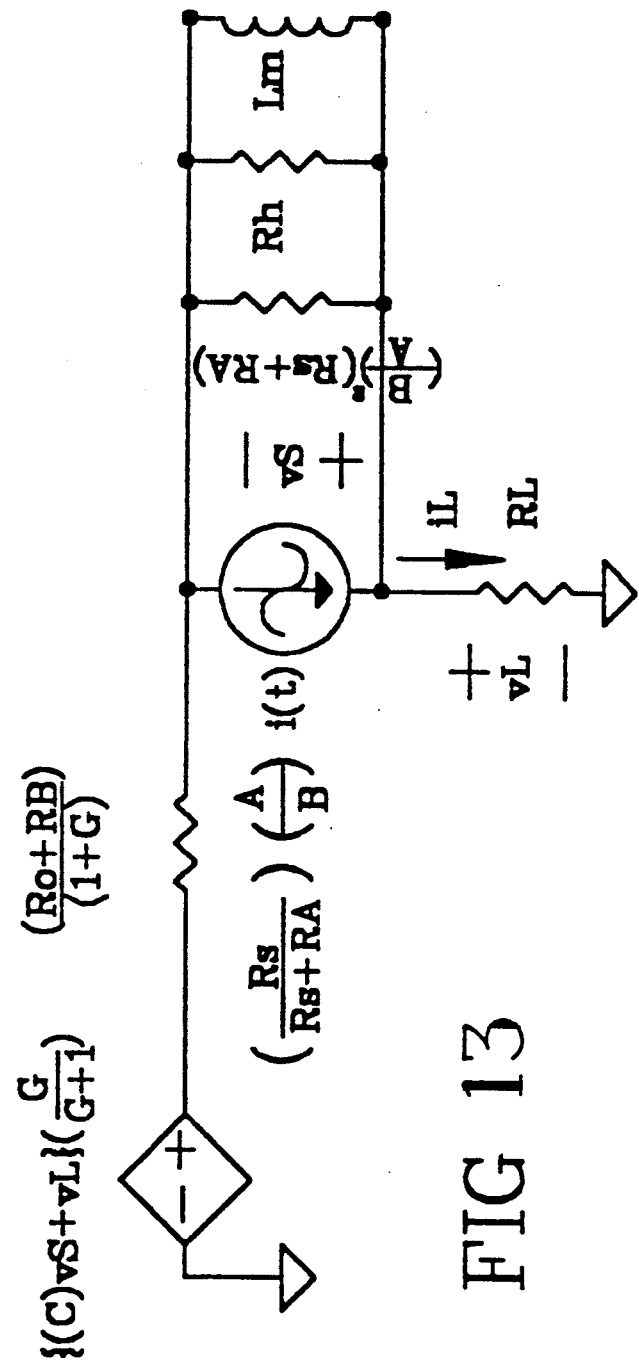
Figure 14:
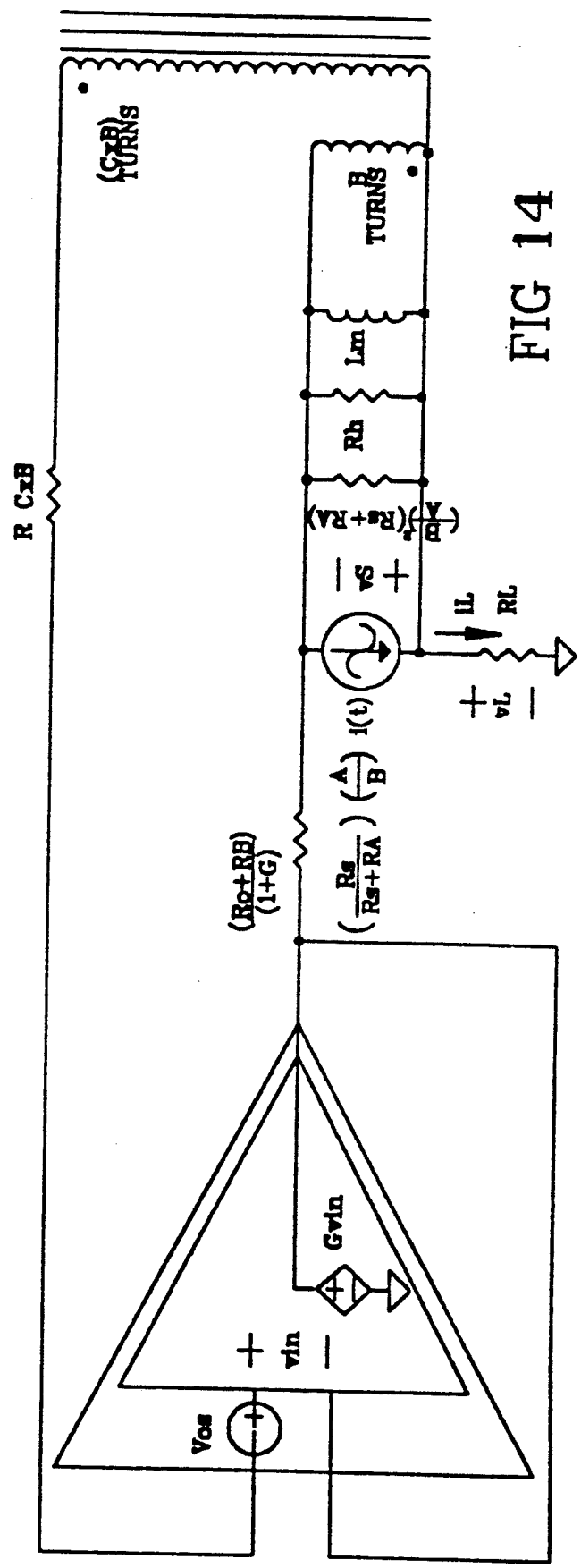
Figure 15A:
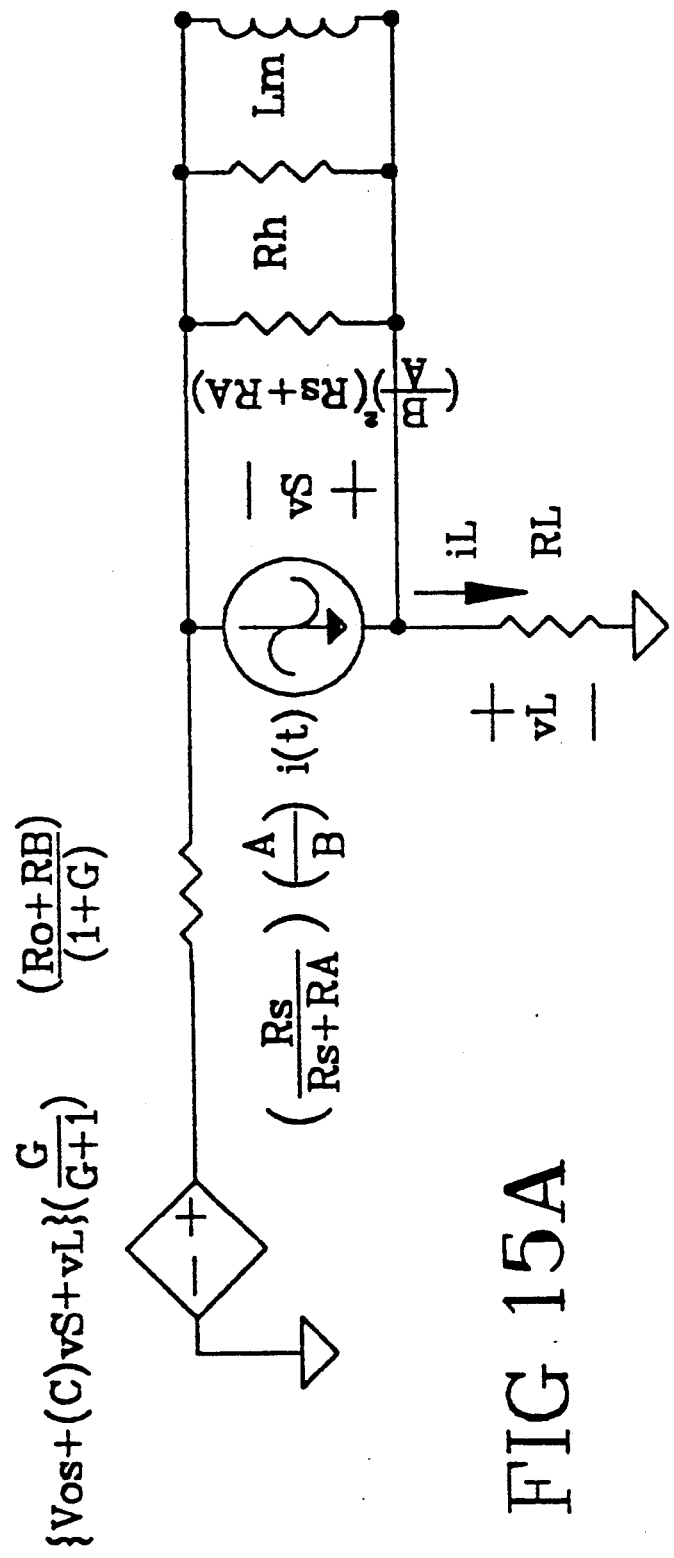
Figure 15B:
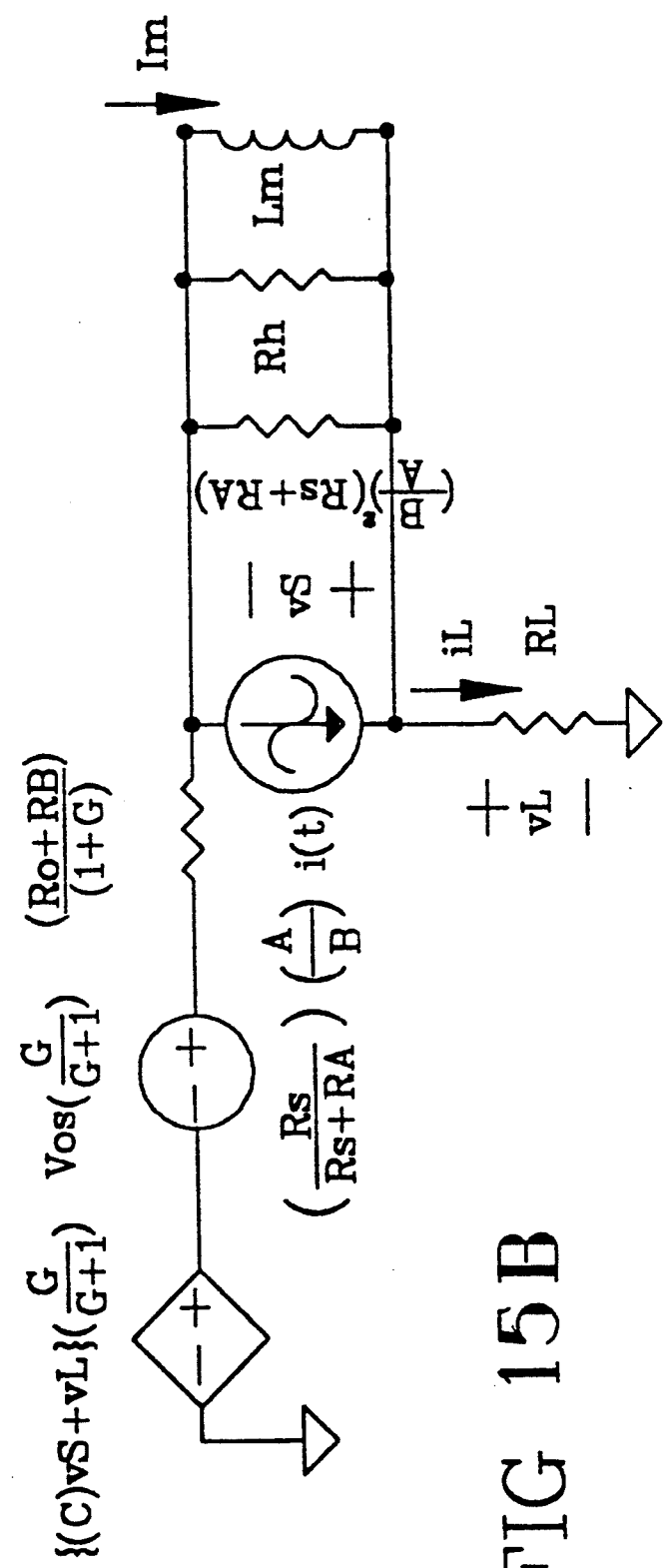
Figure 16:
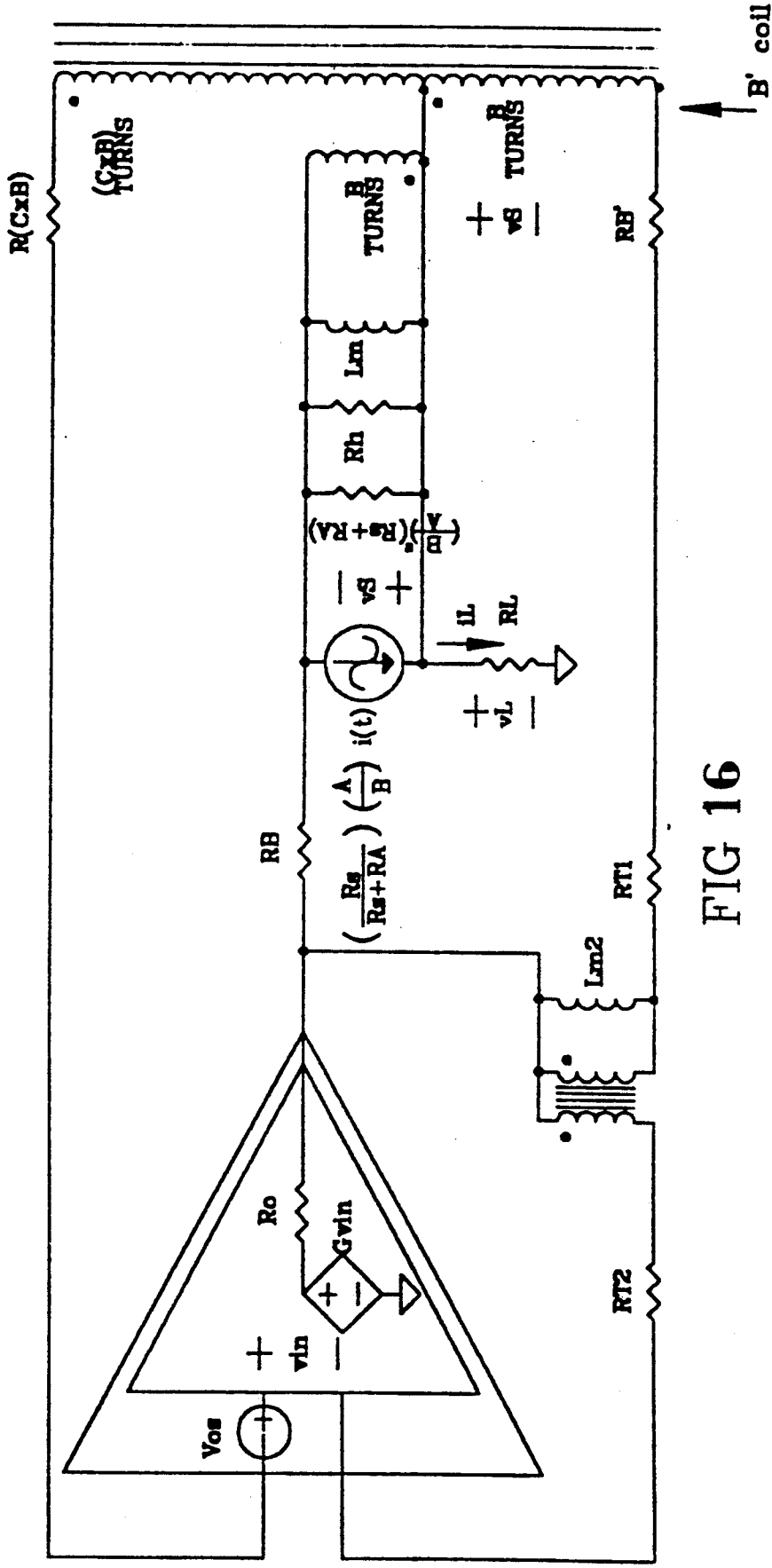
Figure 17:
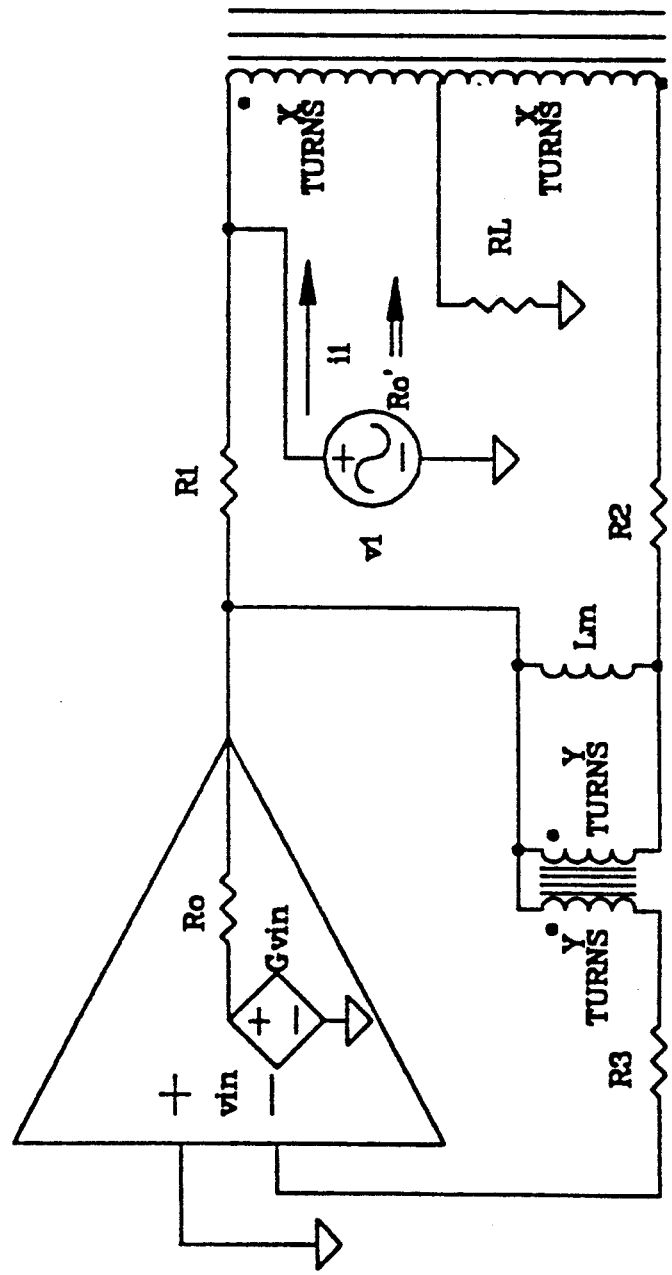
Figure 18:
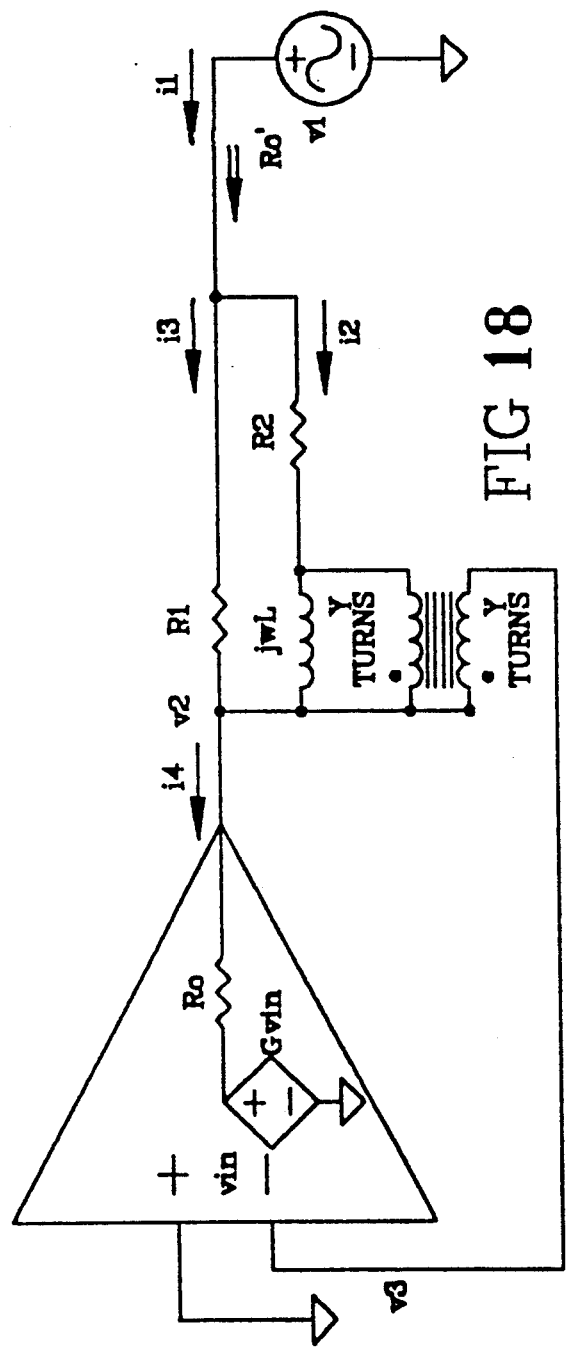
Figure 19:
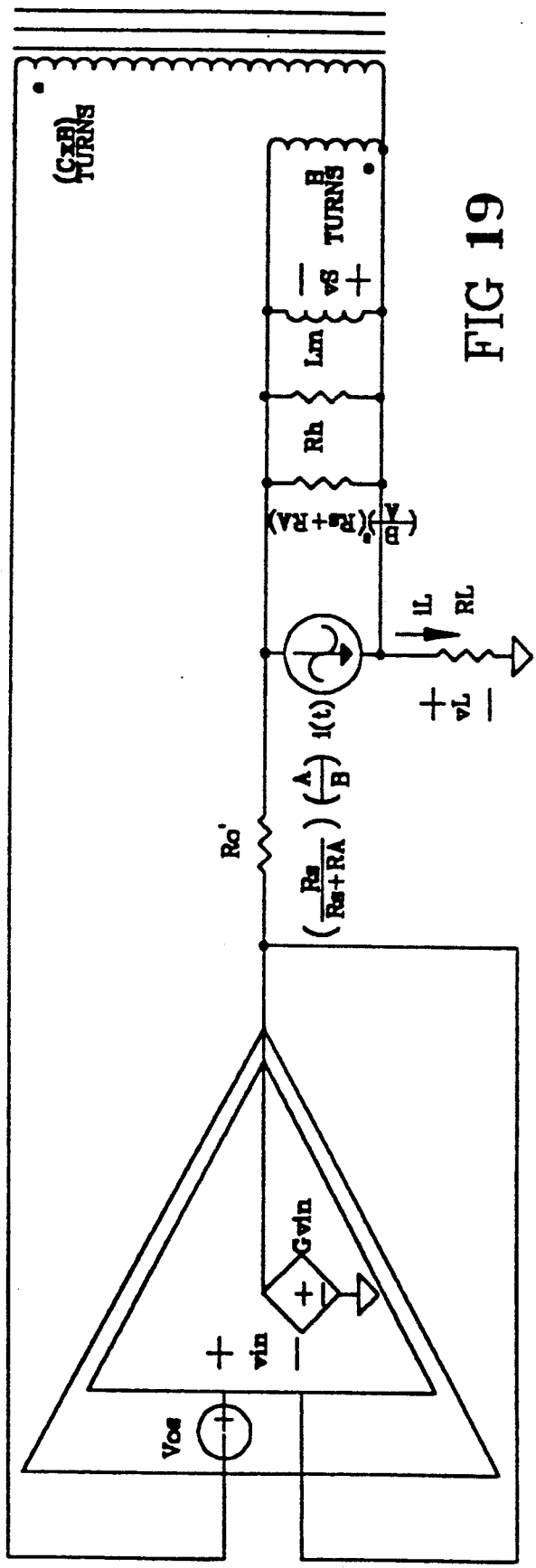
Figure 20:
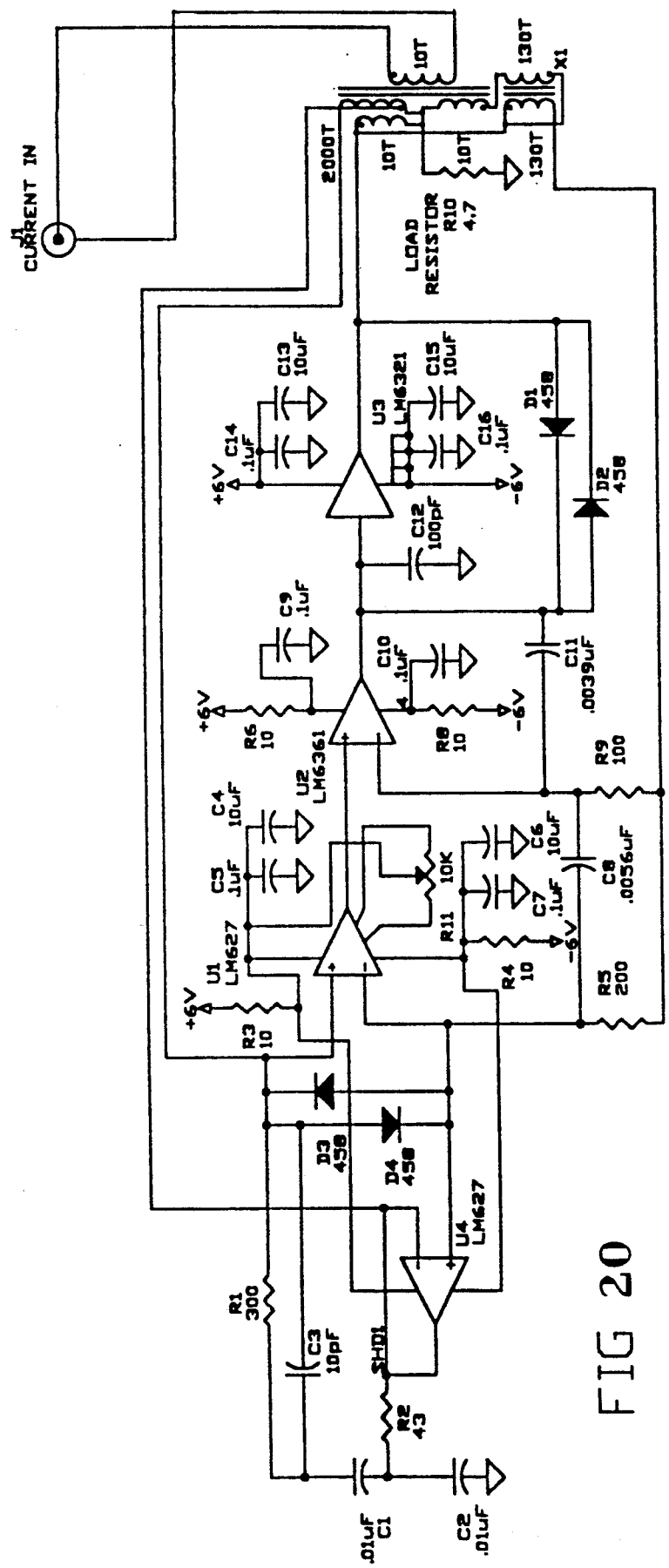
Figure 21:
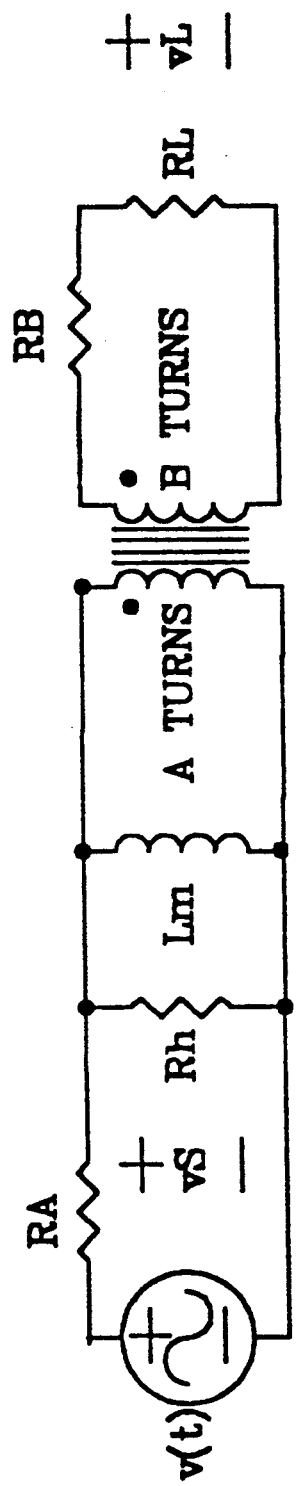
Figure 22:
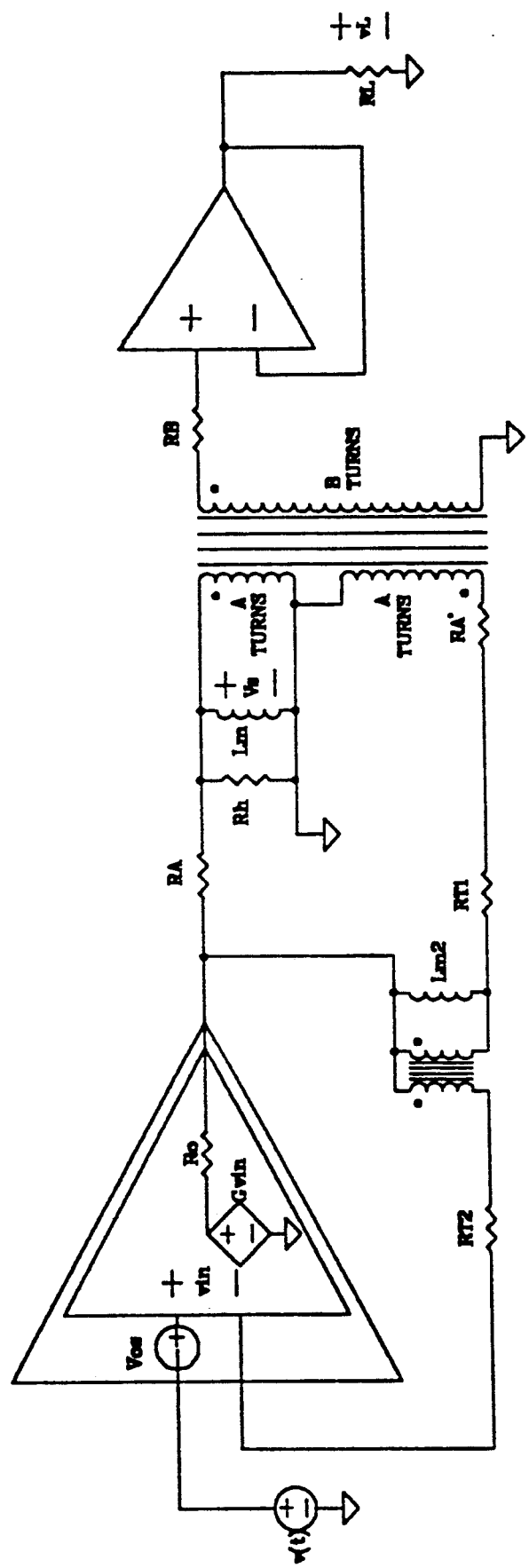
Figure 23:
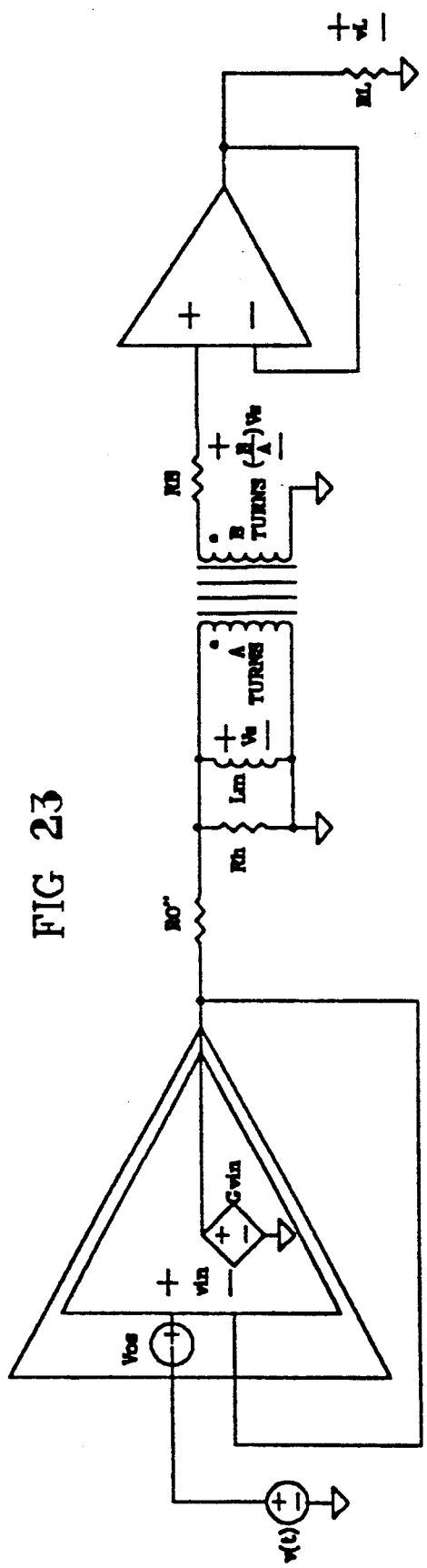

FIG 3. illustrates a simplification of the schematic illustrated in FIG. 2;

FIG. 4 illustrates a simplification of the schematic illustrated in FIG. 3;

FIG. 5 illustrates a non-idealized version of the schematic illustrated in FIG. 2;

FIGS. 6A-C illustrate successive degrees of simplification of the circuit illustrated in FIG. 5;

FIG. 7 illustrates a simplification of the circuit illustrated in FIG. 6C;

FIG. 8 illustrates a simplification of the circuit illustrated in FIG. 7;

FIG. 9 illustrates a simplification of the circuit illustrated in FIG. 8;

FIG. 10 illustrates a simplification of the circuit illustrated in FIG. 9;

FIG. 11A-B illustrate a circuit useful in simplification of the circuit illustrated in FIG. 10;

FIG. 12 illustrates a simplification of the circuit illustrated in FIG. 10;

FIG. 13 illustrates a simplification of the circuit illustrated in FIG. 12;

FIG. 14 illustrates the effect of DC offset on the circuit illustrated in FIG. 13;

FIG. 15A illustrates a simplification of the circuit illustrated in FIG. 13;

FIG. 15B illustrates a simplification of the circuit illustrated in FIG. 15A;

FIG. 16 illustrates a circuit for solving the DC offset problem;

FIG. 17 illustrates a simplification of the circuit illustrated in FIG. 16;

FIG. 18 illustrates a simplification of the circuit illustrated in FIG. 17;

FIG. 19 illustrates a simplification of the circuit illustrated in FIG. 18;

FIG. 20 illustrates a high frequency stabilization enhancement according to the invention;

FIG. 21 illustrates a circuit useful in understanding winding resistance and exciting current limitations in potential transformers;

FIG. 22 illustrates a circuit useful in overcoming the effects of winding resistance and exciting current;

FIG. 23 illustrates a simplification of the circuit illustrated in FIG. 22; and

Figure 24:
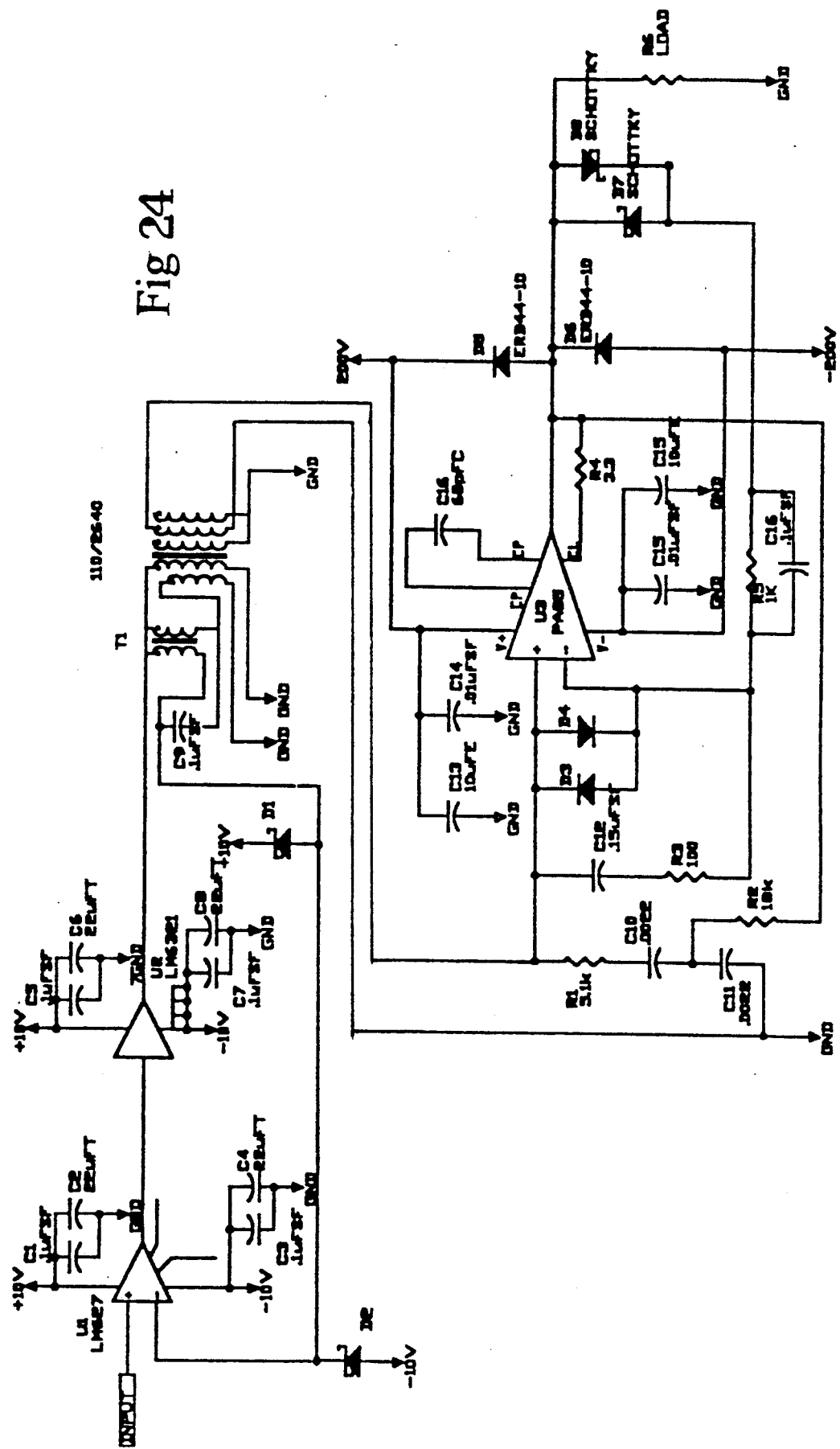

FIG. 24 illustrates a schematic of a fully compensated potential transformer.

FIG. 2 illustrates a new technique for reducing the voltage burden presented to the transformer. This circuit uses a CT with an additional winding and an amplifier in a novel way to reduce the voltage burden presented by the load to the transformer. In this circuit the windings are very tightly coupled and the non-mutual flux is virtually zero. A current source drives the A turn primary of the CT. The B turn secondary of the CT is coupled between the output of an operational amplifier and the load resistor ($R_L$) The other end of $R_L$ is coupled to ground. The CxB turn winding is coupled between the junction of $R_L$ and the B turn winding and the non-inverting (+) input of the operational amplifier. The operational amplifier has an open loop gain of G and is configured as a unity gain amplifier. In this configuration, the amplifier will have a closed loop gain of $G/(G+1)$. For large values of G, the gain approaches 1. For convenience, the hysteresis/eddy current losses resistor ($R_h$) and the magnetizing inductance ($L_m$) of this transformer are illustrated as separate items appearing across the B turn secondary winding. As can be readily seen, any voltage burden appearing at $V_S$ will introduce error currents flowing in $L_m$ and $R_h$.

The voltage burden that appears at $V_S$ as a function of the voltage burden $V_L$ that appears across $R_L$ can be calculated as follows. The schematic of FIG. 2 can be simplified by reflecting the current source i(t) across the transformer from the A turn coil to the B turn coil. This is illustrated in FIG. 3. The current source has been multiplied by the turns ratio A/B and appears in parallel with $L_m$ and $R_h$. Since the A turn coil is now connected to an open circuit, it can be ignored.

The schematic can be simplified even further by converting the output of the operational amplifier into a dependent voltage source. This is illustrated in FIG. 4. The voltage at the input of the operational amplifier is $V_L + (C)V_S$. When this is multiplied by the gain of the amplifier, the output of the operational amplifier becomes a dependent voltage source whose output voltage is $\{G/(G+1)\}\{(C)V_S + V_L\}$. The input impedance of an operational amplifier is virtually infinite. Since the CxB turn coil is connected to an open circuit it can be ignored. Since the B turn coil now presents no load to the circuit it can also be ignored. The transformer is now entirely removed from the schematic except for the parasitic loads $R_h$ and $L_m$ and the mathematical expressions for its effects on the dependent voltage source and the reflected current source.

Using Kirchhoff's voltage law, equation 1 can be written $$\{(C)V_{S+VL}\}\{G/(G+1)\} + V_S = V_L$$

Expanding and combining terms, equations 2 and 3 can be written.

$$\{(CG)/(G+1)\}V_S + \{G/(G+1)\}V_L + V_S = V_L \quad 2$$

$$[\{(C+1)G+1\}/(G+1)]V_S = \{1/G+1\}V_L \quad 3$$

Solving for $V_S$ yields equation 4.

$$V_S = [1/\{(C+1)G+1\}]V_L \quad 4$$

If C=100 and G=100,000 (reasonable Values for transformers and operational amplifiers) then $$V_S = 9.9010 \times 10^{-8} V_L \quad 5$$

As can be seen, the voltage burden presented to the magnitude.

The preceding analysis dealt only with lossless windings, ideal current sources and zero output impedance operational amplifiers. It ignored the effects of the parasitic resistance present in most real world circuits. 15 This circuit with these elements having parasitic resistance will now be considered to demonstrate how these components degrade the performance from the ideal performance previously calculated. A circuit modification that substantially reduces the effects of two of these resistances will then be developed.

The non-idealized circuit is illustrated in FIG. 5. In it, a parallel source resistance ($R_S$) to the constant current input and a series output resistance ($R_O$) to the operational amplifier have been recognized. Winding resistance resistors ($R_A$, $R_B$, & $R_{C \times B}$) have also been added to the individual windings. Except for these revisions the model is the same as was illustrated in FIG. 2.

The A turn winding in the earlier analysis can be eliminated by reflecting the current source across the transformer to the B turn winding. This is more difficult than in the earlier analysis because $R_S$ and $R_A$ must be dealt with. To do this, Norton and Thevenin equivalent circuits are used to combine $R_S$ and $R_A$ into a single equivalent resistor and reflect this across the transformer. FIGS. 6A, 6B, and 6C illustrate this process. FIG. 6A illustrates the original non-ideal current source and the winding resistance $R_A$. In FIG. 6B, the non-ideal current source i(t) and $R_S$ have been transformed to their Thevenin equivalent. Once transformed, $R_S$ and $R_A$ can be combined into one resistor. In FIG. 6C, the circuit has been transformed back into its Norton equivalent. It is interesting that the effective current of the new non-ideal current source was reduced by the factor $\{R_S/(R_S+R_A)\}$. This factor ends up directly multiplying the input current. This affects the accuracy of the transformer regardless of how closely $V_S$ is reduced to zero. It is also noteworthy that if the original current source is ideal, that is, if $R_S$ goes to infinity, this factor becomes 1 and the non-ideal primary resistance $R_A$ has no impact on accuracy. This non-ideal current source can now be reflected across the transformer as illustrated in FIG. 7. The source resistance of the reflected non-ideal current source is in parallel with the hysteresis/eddy current losses resistor and becomes an additional generator of error current if $V_S$ is not zero.

The schematic can be further simplified by converting the operational amplifier into a dependent voltage source. To do this the non-ideal amplifier is first separated into a zero output impedance operational amplifier and an equivalent output resistance($R_O'$). To determine $R_O'$ of the amplifier, the circuit of FIG. 8 is considered. In this circuit, the non-inverting input of the amplifier is grounded and the output is driven with a voltage source. The resulting current flow is then determined. $R_O'$ is determined by Ohm's law and is the voltage of the voltage source divided by the resultant current flow. To determine the current flow, the following observations are made from the circuit of FIG. 8.

$$V_{in} = -V \quad 6$$

$$R_O' = V/I_1 \quad 7$$

$$I_1 = I_2 + I_3 \quad 8$$

$$I_2 = (V - GV_{in})/R_O \quad 9$$

Because the input impedance of the operational amplifier is virtually infinite $$I_3 = 0 \quad 10$$

Substituting for $I_3$ in equation 8, $$I_1 = I_2 + I_3 = I_2 + 0 = I_2 \quad 11$$

Substituting equations 6 and 11 into equation 9, $$I_2 = (V - Gv_{in})/R_O = \{V - G(-V)\}/o = \{(V)(1+G)\}/R_O = I_1 \quad \quad 12$$

To find $R_O'$ equation 12 is substituted into equation 7.

$$R_O' = V/\{V(1+G)/R_O\} = R_O/(1+G) \quad \quad 13$$

The operational amplifier can now be separated from its equivalent output resistance. This is illustrated in FIG. 9. To convert this amplifier to a dependent voltage source, note that the input impedance to the non-inverting terminal is virtually infinite. There is no current flow in resistor $R_{C \times B}$. Consequently there is no voltage drop across $R_{C \times B}$. The voltage to the non-inverting input terminal of the amplifier is thus $V_L + (C)V_S$. When this is multiplied by the gain of the amplifier, the output of the operational amplifier becomes a dependent voltage source whose output voltage is $\{G/(G+1)\}\{(C)V_S 30 V_L\}$. This is illustrated in FIG. 10.

From FIG. 10 and Kirchhoff's voltage law, equations 14 and 15 can be written.

$$\{(C)V_S + V_L\}\{G/(G+1)\} - i_L\{R_B + R_O/(1+G)\} + V_S = V_L \quad \quad 14$$

$$I_L = V_L/R_L \quad \quad 15$$

substituting equation 15 into equation 14 and expanding, $$\{(CG)/(G+1)\}V_S + \{G/(G+1)\}V_L - [\{R_B + R_O/(G+1)\}/R_L]V_L + V_S = V_L \quad \quad 16$$

Combining terms, equations 17, 18 and 19 are obtained.

$$[\{G(C+1)+1\}/(G+1)]V_S = V_L - \{G/(G+1)\}V_L + \{(R_B + R_O/(G+1))/R_L\}V_L \quad \quad 17$$

$$[\{G(C+1)+1\}/(G+1)]V_S = 1 - G/(G+1) + \{(R_B + R_O/(G+1))/R_L\}V_L \quad \quad 18$$

$$[\{G(C+1)+1\}/(G+1)]V_S = [1/(G+1) + \{(R_b + R_O/(G+1))/R_L\}]V_L \quad \quad 19$$

Solving for $V_S$ yields equation 20.

$$V_S = [(G+1)/\{G(C+1)+1\}] \times [1/(G+1) + \{(R_B + R_O/(G+1))/R_L\}]V_L \quad \quad 20$$

If $C=100$, $G=100,000$, $R_B=0.1\Omega$, $R_O=1\Omega$, and $R_L=10\Omega$ reasonable real world values) then $$V_S = 99.120 \times 10^{-6} V_L \quad \quad 21$$

This is just over a 4 order of magnitude reduction in the voltage applied at $V_S$. This is three orders of magnitude less than the earlier, more idealized version. The effect of even a small winding resistance is quite dramatic. One possible solution to reducing $R_B$ is to include it in the amplifier's feedback loop and use the operational amplifier to reduce the effective resistance of $R_B$. Unfortunately this is not possible because $R_B$ is, in reality, a distributed resistance of the B turn winding and cannot be bypassed directly.

A solution to this problem is illustrated in FIG. 11A. In FIG. 11A, a second B turn winding, designated the B' winding, is added to the transformer and used to reduce the effective series resistance of the original B turn winding. The B' winding is used to effectively move the series resistance $R_B$ inside the feedback loop of the operational amplifier. This can be seen by observing that the voltage across the B' winding is exactly the same as the voltage across the B turn winding. Since the input impedance of the inverting terminal of the operational amplifier is virtually infinite, no current flows through the series resistance ($R_B'$) of the B' winding. This means that the voltage $V_S$ is applied to the inverting input terminal of the operational amplifier. This is exactly the same voltage that would have been experienced if the inverting input terminal to the operational amplifier had been coupled to the winding side of R/hd B. In effect, the inverting input terminal of the operational amplifier has been coupled to the winding side of $R_B$. This effective rewiring is illustrated in FIG. 11B for clarity. This permits the operational amplifier to reduce the effective resistance of $R_B$ as if it were a separable component.

FIG. 12 illustrates the circuit with the effective resistance of the amplifier and winding resistance separated from an idealized amplifier. As in FIG. 10, the operational amplifier and CxB turn coil are converted into a dependent voltage source. This is illustrated in FIG. 13. $V_S$ may be found in terms of $V_L$. From FIG. 13 and Kirchhoff's voltage law equation 22 and 23 are obtained.

$$\{(C)V_S + V_L\}\{G/(G+1)\} - i_L\{(R_B + R_O)/(1+G)\} + V_S = V_L \quad 22 \quad i_L = V_L/R_L \quad 23$$

Substituting equation 23 into equation 22 and expanding, $$\{(CG)/(G+1)\}V_S + \{G/(G+1)\}V_L - [\{(R_B + R_O)/(G+1)\}/R_L]V_L + V_S = V_L \quad \quad 24$$

operational amplifier will now be developed. The basic concept of this enhancement is to separate the low frequency performance from the high frequency performance of the circuit. While the enhancement degrades the reduction of $V_S$ at frequencies well below the frequencies of interest, it will maintain the previously achieved reduction in $V_S$ at frequencies of interest. This will permit startup transients to dampen out and prevent DC offsets from causing the circuit output to run away.

Dealing first with the problem of circuit startup, recall that the object of the basic invention was to remove the effect of the voltage burden ($V_S$). This goal has been largely achieved and $V_S$ has been reduced to virtually zero. When $V_S$ is kept at zero, the flux in the core cannot change. If the flux in the core happens to be at zero, its inability to change is beneficial. If the flux is not at zero, however, then a problem occurs. For the flux not to be zero there must be a current flowing in $L_m$. This current acts on the load just like the current source (A/B)i(t) that was reflected from the primary. Remember that the voltage across the inductor, $V_S$, is virtually zero and that $V = L(di/dt)$ for an inductor. One can see that the current flowing in the inductor will not change or will change only very slowly depending upon the size of $V_S$. What this means is that once a flux is induced into the core, the transformer will deliver an output current to the load even with no input, and it will continue to do so for a long time. Experiments have established that outputs can exist under such circumstances from tens of minutes to several hours. This is a particular problem when one realizes that this happens quite frequently when the circuit is started. If $R_O = 1\Omega$, $R_B = 0.1\Omega$, $V_{OS} = 100 \mu V$, and $G = 100,000$ (reasonable real world values) the DC output current is $I_L = 9.09A$       39

Clearly, this is an unacceptably large output for the no input signal condition.

The solution to both of these problems is to remove the performance of the circuit at DC while maintaining its performance at the frequencies of interest. The means for arriving at this solution is illustrated in FIG. 16 A bifilar wound transformer is added to the circuit. The bifilar wound transformer has been illustrated, with its magnetizing inductance($L_{m2}$) and coil resistances ($R_{T1}$ and $R_{T2}$) explicitly illustrated. The basic concept is that at DC the inductor $L_{m2}$) is a short circuit and at the frequencies of interest $L_{m2}$ becomes a virtual open circuit. At DC the B and B' windings are thus shorted and in parallel. The inverting (−) input terminal of the operational amplifier is also coupled to the output terminal of the operational amplifier. This means that the amplifier provides no reduction in the effective resistance of the coil windings at DC. At the frequencies of operation where $L_{m2}$ is effectively providing an open circuit, the output of the B' coil is unloaded and coupled directly to the inverting input terminal of the operational amplifier. This permits the amplifier and B' coil to reduce the effective resistance of the B turn coil as previously illustrated in connection with the discussion of FIG. 11A and 11B.

To determine the minimum value for $L_{m2}$, the equivalent output impedance of the circuit for any given frequency must first be determined. Then the effect of that impedance on the circuit can be analyzed. To determine the output impedance of this circuit the same approach will be used as was used in the analysis of FIG. 8. The input of the operational amplifier circuit will be coupled to ground and the output thereof will be driven with a voltage source. A simplified version containing only the relevant components of FIG. 16 is illustrated in FIG. 17 The ideal voltage source driving the output is v1. The equivalent output resistance ($R_O$) is determined by dividing the source voltage v1 by the source current i1.

The X turn windings represent the idealized portions of the transformer's B and B' windings that this circuit uses. The load resistor $R_L$ is needed to show how voltages are developed across the X turn windings. Since the X turn windings are part of an idealized transformer, no current can flow into one winding that does not flow out the other winding. This means that no current flows in $R_L$. This means that $R_L$ has no effect on the circuit and the circuit has no direct effect on $R_L$. This also means that the full voltage generated by the voltage source, which is applied to the top X turn winding also appears across the bottom X turn winding. Knowing this, R2 to R1 can be joined and $R_L$ and the X turn transformer eliminated. R3 can also be eliminated because it is in series with the inverting input terminal of the operational amplifier and thus has no effect on the circuit. The simplified circuit is illustrated in FIG. 18. From FIG. 18, the following equations can be written.

$R_O = v1/i1$       40

$i1 = i2 + i3$       41

$i4 = i2 + i3$       42

$i1 = (v1 - Gv_{in})/[R_O + \{(R1)(R2+j\omega L)/(R1+R2+j\omega L)\}]$       43

$v_{in} = v'$       44

$v3 = v2 + i2(j\omega L)$       45

$v2 = i4(R_O) + Gv_{in}$       46

$i2 = i1\{R1/(R1+R2+j\omega L)\}$       47

Substituting 42 into 41,
$i1 = i4$       48

Substituting 48 into 46,
$v2 = i1(R_O) + Gv_{in}$       49

Substituting 49 and 44 into 45, $v3 = -v_{in} = i1(R_O) + Gv_{in} + i2(j\omega L)$       50 substituting 47 into 50, $-v_{in} = i1(R_O) + Gv_{in} + i1\{R1/(R1+R2+j\omega L)\}$       51

Combining terms and simplifying, $(G+1)V_{in} = i1/[R_O + \{(R1)(j\omega L)/(R1+R2+j\omega L)\}]$       52

$v_{in} = -i1\{1/(G+1)\}[R_O + (R1)(j\omega L)/(R1+R2+j\omega L)\}]$       53

Substituting 53 into 43, $i1 = (v1 + i1\{G/(G+1)\}[R_O + \{(R1)(j\omega L)/(R1+R2+j\omega L)\}])/[R_O + \{(R1)(R2+j\omega L)/(R1+R2+j\omega L)\}]$       54

Letting
$y = R_O + \{(R1)(j\omega L)/(R1+R2+j\omega L)\}$       55

$z = R_O + \{(R1)(R2+j\omega L)/(R1+R2+j\omega L)\}$       56 and substituting 55 and 56 into 54.

$i1[R_O + \{(R1)(R2+j\omega L)/(R1+R2+j\omega L)\}])$
$z = v1/z + [i1\{G/(G+1)\}y]/z$       58

$[i1\{y+(R1)(R2)/(R1+R2+j\omega L)\}])$
$z = v1/z + [i1\{G/(G+1)\}y]/z$       58

$[i1\{1/(G+1)\}y + (R1)(R2)/(R1+R2+j\omega L)\}]z = v1/z$       59

$i1 = v1/\{1/(G+1)\}y + (R1)(R2)/(R1+R2+j\omega L)\}$       60

Rearranging to find $R_O$
$R_O = v1/i1 = \{1/(G+1)\}y + (R1)(R2)/(R1+R2+j\omega L)$       61

Substituting 55 into 61, the expression for the equivalent output resistance $R_O$ is $R_O = \{1/(G+1)\}[R_O + \{(R1)(j\omega L)/(R1+R2+j\omega L)\}] + (R1)(R2)/(R1+R2+j\omega L)$       62

Examining this expression at DC, the inductor value goes to zero. $R_O$ becomes $R_O/(G+1)$ in series with the parallel combination of R1 and R2. If the frequency goes sufficiently high that $j\omega L$ is virtually infinite, then $R_O$ becomes the sum of $R_O$ and R1 reduced by the gain of the operational amplifier. The equation indicates that the circuit performs as expected.

Translating this back into the original parameters of FIG. 16 and redrawing yields FIG. 19 wherein:

$$R_\sigma = \{1/(G+1)\}[R_O + \{(R_B)(j\omega L)/(R_B + R_{B'} + R_{T1} + j\omega L_{m2})\} + (R_B)(R_{B'} + R_{T1})/(R_B + R_{B'} + R_{T1} + j\omega L)] \quad (63)$$

In this circuit the effective series resistance of the windings is not reduced at DC but is reduced at the frequencies of interest. To find the relationship between $V_S$ and $V_L$, note that FIG. 19 is identical to FIG. 4 except that $R_\sigma$ has replaced the expression $(R_O + R_B)/(G+1)$. To find the expression relating $V_S$ to $V_L$ all that needs to be done is to replace $(R_O + R_B)/(G+1)$ with $R_O$ in the solution for FIG. 14.

Substituting $R_\sigma$ from equation 63 in place of $(R_O + R_B)/(G+1)$ in equation 36 yields equation 64.

$$V_S = [(G+1)\{G(C+1)+1\}] \times [\{1/(G+1) + (R_\sigma R_L)\} V_L - \{(G/(G+1))V_{OS}\}] \quad (64)$$

The following observations are helpful to determine the size that $L_{m2}$ must be for a certain amount of degradation. The term $\{G/(G+1)\}V_{OS}$ occurs only at DC and can be removed from the equation when dealing with the frequencies of interest. The ideal case occurs when $(R_\sigma/R_L)V_L$ goes to zero. This means that if it is desired to have the real voltage at $V_S$ to be only X times the voltage of the ideal case, equation 65 must be solved:

$$\text{mag}\{1/(G+1) + (R_\sigma R_L)\} < \text{mag}\{b\ 1/(G+1)\}(X) \quad (65)$$

The variables G and $R_\sigma$ are complex, making this a very tedious equation to solve for the general case. Equation 65 can, however, be solved, fairly easily for any specific case. By iteratively solving equation 65, the critical value for $L_{m2}$ for any desired value of X and specific component values can be determined. For example $R_O = 1\Omega$, $R_B = 0.1\Omega$, $R_{B'} = 0.1\Omega$, $R_{T1} = 0.1\Omega$, $G = 99,999$ and $\omega L = 200\Omega$ then $\text{mag}\{R_\sigma\} = 1.1 \times 10^{-5}$. If this value is inserted into equation 65, $X = 2.1$. This means that for this case the error is only 2.1 times the theoretical best available without any parasitic resistance. If this value of X is satisfactory, the solution is complete. If not, $L_{m2}$ is increased or decreased as desired and the results checked.

For the above values the AC performance of the circuit has not suffered significantly. The AC error in $V_S$ is still nearly the seven orders of magnitude calculated for the ideal case. The DC output with no input however has been significantly reduced. The above values yield the following value for $R_\sigma$ at DC.

$$R_\sigma = \{1/(G+1)\}(R_O) + (R_{B'} + R_{T1})/(R_B + R_{B'} + R_{T1}) = 66.7 \times 10^{-3}\ \Omega \quad (66)$$

If $V_{OS} = 100\ \mu V$ as in the earlier case, the current flow $I_m$ through the inductor $L_m$ is $$p\ I_m = V_{OS}\{G/(G+1)\}/R_\sigma = 1.5 \times 10^{-3} A \quad (67)$$

This is nearly four orders of magnitude less than the over 9A that flowed without the bifilar wound transformer in the circuit.

The introduction of the bifilar wound transformer permits the circuit to have a much larger dampening resistor at DC than it does at AC. This resistance substantially reduces the problems of start up transients and DC offset. In the example (which is quite reflective of the real world), the improvement was nearly 4 orders of magnitude with only a factor of 2 increase in AC error.

One final enhancement is desirable. This is high frequency stabilization. At some frequency, the inter- and intra-winding capacitances cause the transformer to resonate. The circuit becomes unstable. For the circuit to work properly, this instability must be eliminated. To do this a network is added that permits the transformer to work at the frequencies of interest but dampens the transformer at the resonant frequency. The solution to this problem is illustrated in FIG. 20.

FIG. 20 illustrates a schematic for a functionally compensated current transformer. The dampening network includes components C1, C2, C3, R1, R2, and U4. The basic concept of the circuit is as follows. The self-resonant frequency for a properly constructed transformer is normally well above the frequencies of interest. If the transformer is loaded beyond the critical dampening point at these frequencies, the transformer can be stopped from ringing at its resonant point. The object is to load the transformer at high frequencies while not loading it at the frequencies of interest.

The six components in the dampening network of FIG. 20 accomplish this. Operational amplifier U4 is a unity gain buffer whose output voltage is virtually identical to the voltage across the load resistor R10. Resistor R2 and capacitor C2 together comprise a low pass filter for this output voltage. At the frequencies of interest, this low passed voltage follows the load voltage. At high frequencies, this voltage is effectively zero and this point is a high frequency AC ground.

The bulk of the circuit's capacitance that causes the transformer to ring occurs across the 200Ω resistor and is coupled to the 2000 turn winding and to the high frequency ground through capacitor C1. As stated earlier, at the frequencies of interest, the low-passed voltage of R2 and C2 is identical to the load voltage. Since the voltages across all the windings of the transformer are virtually zero, all points connected to the transformer are at the same AC voltage for the frequencies of interest. This means that the voltage across resistor R1 is virtually zero. With no voltage across it, R1 provides no loading at the frequencies of interest. At high frequencies, however, the low-passed voltage acts as an AC ground, causing R1 to load the 2000 turn winding.

With the addition of this circuit, the transformer has been effectively stabilized. A fully functional, compensated current transformer has been achieved. The component values of C1, C2, C3, R1 and R2 were empirically determined.

Potential transformers (PTs), like current transformers, are used in instrumentation to multiply and divide potentials by exact turns ratios Just as with CTs, this capability is useful in measurement and calibration. Unfortunately, PTs also have unresolved problems that affect size and accuracy. These problems include winding resistance and exciting current.

These problems can be illustrated with the circuit in FIG. 21. The first problem occurs because of the secondary winding resistance ($R_B$). There is a voltage division between $R_B$ and the load resistor ($R_L$) which causes an error in the output voltage ($V_L$). The combination of $R_L$ and $R_B$ can also be reflected to the primary side of the transformer and shown to produce additional error by causing voltage division with the winding resistance $R_A$ of the primary. This problem is well known and is normally addressed by making $R_B$ as small as possible and $R_L$ as large as possible. $R_B$ can be made small by increasing the size of the secondary winding and making it from as conductive a material as possible. $R_L$ can be made large by amplification. With modern operational amplifiers, this value can be made to be virtually infinite for many cases. Although the error is never completely eliminated, the problem can usually be made vanishingly small at a reasonable cost.

The second problem is more difficult to address. The hysteresis/eddy current losses resistor $R_h$ and the magnetizing inductance $L_m$ of the transformer form a voltage divider with the primary coil's resistance $R_A$. As earlier pointed out, this voltage division results in error in the output of the PT. The basic approach to solution of this problem is similar to the solution of the first problem, but has not been as successful. $R_A$ can be reduced by increasing the size and conductance of the primary winding. The problem is that a practical method of using amplification to increase $R_h$ and $L_m$ has not been found. They are difficult to increase and solutions that increase these values also tend to increase $R_A$. $L_m$ and $R_h$ are frequently increased by increasing the number of turns in the primary winding. This unfortunately also increases $R_A$. $R_h$ is frequently reduced by increasing the size of the core and reducing flux density. This makes the mean turn length of the winding longer and thus increases the winding's resistance. Frequently, by the time enough core and copper have been added to yield acceptable error results, the transformer has become quite expensive.

Certain enhancements which were added to the current transformer discussed previously can also be applied to potential transformers. The basic concept is to use these enhancements to reduce the effective series resistance $R_A$ to as small a value as possible. The voltage division error is proportional to $R_A/(R_h+j\omega L_m)$. The error becomes smaller in direct proportion to how much the effective value of $R_A$ is reduced. The first of these enhancements gives the ability to reach inside the transformer and reduce the effective winding resistance. The second enhancement compensates for the detrimental effects of the offset voltage in the operational amplifier, while maintaining the benefits of the first enhancement. A circuit which demonstrates these phenomena is illustrated in FIG. 22.

Using the solutions of FIGS. 16 through 19 developed previously, FIG. 22 can be redrawn as FIG. 23. The formula for the new effective series resistance ($R_{O'}$) is taken from equation 63, the effective series resistance ($R_O$) for FIG. 19.

Substituting $R_A$, $R_{A'}$, and $R_{O'}$ for $R_B$, $R_{B'}$, and $R_O$ in equation 63 yields $$R_{O'}=\{1/(G+1)\}[R_O+\{(R_A)(j\omega L)/(R_A+R_{A'}+R_{T1}+j\omega L_{m2})\}]+(R_A)(-R_{A'}+R_{T1})/(R_A+R_{A'}+R_{T1}+j\omega L) \quad 68$$

As noted earlier, this can reduce the effective series resistance quite dramatically. As an example, if $R_O=1\omega$, $R_A=0.1\Omega$, $R_{A'}=0.1\Omega$, $R_{T1}=0.1\Omega$, $G=99,999$ and $\omega L_{m2}=200\Omega$ then $\text{mag}\{R_{O'}\}=1.1\times 10^{-5}$. This is about a four order of magnitude reduction in effective series resistance. This is a considerable improvement over just the A turn winding alone. This means a four order of magnitude reduction in error from exciting currents and winding resistance.

The process for determining the critical value of $L_{m2}$ is identical to that established earlier. Replacing $R_O$ with $R_{O'}$, one can simply iteratively solve equation 65 to find the value of $L_{m2}$ the gives the desired value for X.

One major difference between the use of this circuit in a CT and a PT should be kept in mind. In a CT, the operational amplifier that corrects for resistance supplies little or no power to the core. It supplies all its power to the load. This is because the voltage across the secondary winding is virtually zero and current without voltage delivers no power. In a PT, the primary and secondary windings are at non-zero voltages. The operational amplifier thus supplies power to the hysteresis/core losses resistor and current to the magnetizing inductance. This power and current do not directly affect results. They can, however, cause secondary effects such as core heating and core saturation that may affect results if not properly considered.

One final enhancement is desirable to produce a fully compensated circuit. This is the high frequency stabilization of the circuit. The inter- and intra-winding capacitances cause the transformer to resonate. This tendency must be eliminated. As with the current transformer, this resonance will be eliminated by adding a dampening resistor effective at high frequencies and ineffective at the frequencies of interest.

FIG. 24 illustrates a schematic for a fully compensated potential transformer. U3 is a high voltage operational amplifier hybrid. It buffers the output of the transformer. It also drives a compensation network. The compensation network includes R1, R2, C10, and C11. R2 and C11 form a low pass filter for the output of U3. The filter is so designed that at the frequencies of interest, no voltage drop occurs across R1. This removes R1 from the load at these frequencies. At high frequencies where the transformer resonates, one side of R1 is at AC ground and the other is coupled to the output of the transformer. This loads the transformer and prevents the ringing that would otherwise occur. The component values for R1, R2, C10 and C11 were empirically determined.

What is claimed is:

1. Means for compensating a transformer having a primary winding and a secondary winding comprising a load, and means for coupling the load across the secondary winding, the means for coupling the load across the secondary winding including a third winding on the transformer, an amplifier, means for coupling a first input terminal of the amplifier to a first terminal of the secondary winding, and the third winding coupling an output terminal of the amplifier to the load and to a second terminal of the secondary winding.

2. The transformer compensating means of claim 1 wherein the amplifier is a difference amplifier, the output terminal of which is coupled to a second, inverting input terminal thereof to configure the amplifier as an approximately unity gain amplifier.

3. The transformer compensating means of claim 1 wherein the third winding has the same polarity as the secondary winding.

4. The transformer compensating means of claim 2 wherein the third winding has the same polarity as the secondary winding.

5. The transformer compensating means of claim 1 further comprising a fourth winding on the transformer, means for coupling a first terminal of the fourth winding to the second terminal of the secondary winding, and means for coupling a second terminal of the fourth winding to a second input terminal of the amplifier.

6. The transformer compensating means of claim 5 wherein the amplifier comprises a difference amplifier, the second input terminal of the amplifier comprising an inverting input terminal thereof.

7. The transformer compensating means of claim 6 wherein the fourth winding has the same polarity as the secondary winding.

8. The transformer compensating means of claim 7 wherein the third and fourth windings have the same number of turns.

9. The transformer compensating means of claim 5, 6, 7 or 8 and further comprising a second transformer having first and second windings, means for coupling a first terminal of each of the first and second windings of the second transformer to the output terminal of the amplifier, means for coupling a second terminal of the first winding to the second input terminal of the amplifier, and means for coupling a second terminal of the second winding of the second transformer to the second terminal of the fourth winding, the means for coupling the second terminal of the fourth winding to the second input terminal of the amplifier comprising the second transformer.

10. The transformer compensating means of claim 9 wherein the first and second windings of the second transformer have the same number of turns.

11. The transformer compensating means of claim 9 and further comprising a high frequency stabilizing circuit including a second amplifier, means for coupling the secondary winding across an input terminal and an output terminal of the second amplifier, means providing a low-pass filter, and means for coupling the low-pass filter to the output terminal of the second amplifier.

12. The transformer compensating means of claim 11 wherein the low-pass filter comprises an R-C filter.

13. The transformer compensating means of claim 11 wherein the means for coupling the secondary winding across an input terminal and the output terminal of the second amplifier includes the second transformer.

14. The transformer compensating means of claim 13 wherein the means for coupling the secondary winding across an input terminal and the output terminal of the second amplifier further comprises the fourth winding.

15. The transformer compensating means of claim 11 wherein the means for coupling the secondary winding across an input terminal and the output terminal of the second amplifier comprises the fourth winding.

16. The transformer compensating means of claim 11 wherein the second amplifier comprises a difference amplifier including the first-mentioned input terminal and a second, inverting input terminal, and means for coupling the inverting input terminal of the second amplifier to its output terminal in substantially unity gain, non-inverting configuration.

17. The transformer compensating means of claim 16 and further comprising a resonance damping resistor and means for coupling the resonance damping resistor across the secondary winding.

18. The transformer compensating means of claim 17 wherein the means for coupling the resonance damping resistor across the secondary winding includes the low-pass filter and the output terminal of the second amplifier.

19. Means for compensating a transformer having a primary winding and a secondary winding comprising a load, means for coupling the load across the secondary winding, a third winding on the transformer, an amplifier, means for coupling a first output terminal of the amplifier to a first terminal of the primary winding, means for coupling a first terminal of the third winding to the second terminal of the primary winding, and means for coupling a second terminal of the third winding to an input terminal of the amplifier.

20. The transformer compensating means of claim 19 wherein the amplifier comprises a difference amplifier, the input terminal of the amplifier comprising an inverting input terminal thereof.

21. The transformer compensating means of claim 20 wherein the third winding has the same polarity as the primary winding.

22. The transformer compensating means of claim 21 wherein the primary and third windings have the same number of turns.

23. The transformer compensating means of claim 19, 20, 21 or 22 and further comprising a second transformer having first and second windings, means for coupling a first terminal of each of the first and second windings of the second transformer to the output terminal of the amplifier, means for coupling a second terminal of the first winding to the second input terminal of the amplifier, and means for coupling a second terminal of the second winding of the second transformer to the second terminal of the third winding, the means for coupling the second terminal of the third winding to the input terminal of the amplifier comprising the second transformer.

24. The transformer compensating means of claim 23 wherein the first and second windings of the second transformer have the same number of turns.

25. The transformer compensating means of claim 23 and further comprising a high frequency stabilizing circuit including a second amplifier, means for coupling the secondary windings across an input terminal and an output terminal of the second amplifier, means providing a low-pass filter, and means for coupling the low-pass filter to the secondary winding and to the output terminal of the second amplifier.

26. The transformer compensating means of claim 25 wherein the low-pass filter comprises an R-C filter.

27. The transformer compensating means of claim 25 and further comprising a resonance damping resistor and means for coupling the resonance damping resistor across the secondary winding.

28. The transformer compensating means of claim 27 wherein the means for coupling the resonance damping resistor across the secondary winding includes the low-pass filter and the output terminal of the second amplifier.

* * * * *